(12) United States Patent
Wang et al.

(10) Patent No.: US 7,745,313 B2
(45) Date of Patent: Jun. 29, 2010

(54) SUBSTRATE RELEASE METHODS AND APPARATUSES

(75) Inventors: David Xuan-Qi Wang, Freemont, CA (US); Mehrdad M. Moslehi, Los Altos, CA (US)

(73) Assignee: Solexel, Inc., Milpitas, CA (US)

( * ) Notice: Subject to any disclaimer, the term of this patent is extended or adjusted under 35 U.S.C. 154(b) by 0 days.

(21) Appl. No.: 12/473,811

(22) Filed: May 28, 2009

(65) Prior Publication Data

US 2010/0022074 A1      Jan. 28, 2010

Related U.S. Application Data

(60) Provisional application No. 61/056,722, filed on May 28, 2008.

(51) Int. Cl.
*H01L 21/762* (2006.01)
*H01L 21/20* (2006.01)

(52) U.S. Cl. .......................... 438/479; 438/57; 438/73; 257/E21.09; 257/E21.561

(58) Field of Classification Search ................. 438/57, 438/73, 479
See application file for complete search history.

(56) References Cited

U.S. PATENT DOCUMENTS

| 2008/0210294 A1* | 9/2008 | Moslehi | 136/251 |
| 2008/0289684 A1* | 11/2008 | Moslehi | 136/255 |
| 2009/0042320 A1* | 2/2009 | Wang et al. | 438/5 |
| 2009/0107545 A1* | 4/2009 | Moslehi | 136/256 |

\* cited by examiner

*Primary Examiner*—Alexander G Ghyka
(74) *Attorney, Agent, or Firm*—Hulsey, P.C.

(57) ABSTRACT

The present disclosure relates to methods and apparatuses for fracturing or breaking a buried porous semiconductor layer to separate a 3-D thin-film semiconductor semiconductor (TFSS) substrate from a 3-D crystalline semiconductor template. The method involves forming a sacrificial porous semiconductor layer on the 3-D features of the template. A variety of techniques may be used to fracture and release the mechanically weak porous semiconductor layer without damaging the TFSS substrate layer or the template layer such as pressure variations, thermal stress generation, and mechanical bending. The methods also allow for processing three dimensional features not possible with current separation processes. Optional cleaning and final lift-off steps may be performed as part of the release step or after the release step.

23 Claims, 29 Drawing Sheets

SUBSTRATE RELEASE METHODS AND APPARATUSES

CROSS-REFERENCE TO RELATED APPLICATIONS

The present U.S. Utility patent application claims priority pursuant to 35 U.S.C. §119(e) to the following U.S. Provisional Patent Application which is hereby incorporated herein by reference in its entirety and made part of the present U.S. Utility patent application for all purposes:

a. U.S. Provisional Application Ser. No. 61/056,722, entitled "SUBSTRATE RELEASE METHODS AND APPARATUSES,", filed on May 28, 2008, pending.

The present U.S. Utility patent application is related to and incorporates by reference the following copending U.S. patent application in its entirety and is made part of the present U.S. Utility patent application for all purposes:

1. U.S. Utility application Ser. No. 11/868,489, entitled "METHOD FOR MANUFACTURING THREE-DIMENSIONAL THIN FILM SOLAR CELLS,", filed Oct. 6, 2007, pending

FIELD OF THE INVENTION

This disclosure relates in general to the field of photovoltaic and electronic device manufacturing. More specifically, fracturing a buried porous semiconductor layer releasing a self-supporting three-dimensional honeycomb prism thin film semiconductor substrate (3-D TFSS) from a re-usable template that has corresponding three-dimensional structures.

BACKGROUND OF THE INVENTION

Separating one silicon layer from another silicon layer by fracturing a thin and mechanically weak/fragile intermediate silicon layer has been widely known in making silicon-on-insulator (SOI) wafers for producing semiconductor devices. However, prior methods have several drawbacks. For example, most prior art methods require a planar intermediate layer separating the device layer and the substrate layer. U.S. application Ser. No. 11/868,489 having common inventor, Mehrdad Moslehi, of the present disclosure discloses a 3-D thin-film semiconductor device where prior art manufacturing methods may not be suitable.

Instead of having a flat porous silicon layer, the honeycomb 3-D TFSS and the template wafer comprise three-dimensional microstructures with high-aspect-ratio deep trenches made into the silicon template. As a result, the effective interface area between porous silicon layer and nonporous silicon layers is at least five times larger than that of a flat substrate. The large interface area per unit volume increases the magnitude of external energy/force that is required for fracturing the porous silicon layer. Prior art methods may not be suited to fracture the porous silicon, while mitigating damage to both the template and 3-D TFSS.

In addition, most release methods in the prior arts require a mechanical supporting plate bonded or attached by adhesive on top of the thin epitaxial silicon layer to be released. In addition to serving as a mechanical support, the bonded top plate may also absorb the external energy and generate a stress on the layer to be released. Without the top supporting plate, many of the prior art release methods are either less effective or cause mechanical damage to the released thin-film. U.S. application Ser. No. 11/868,489 discloses a 3-D TFSS which is not conducive to the use of a top supporting plate for release and post-release processes because: (i) it is not convenient to bond a supporting plate on top of the square 3-D TFSS to be released while preventing the supporting plate from attaching to the wafer surface outside of the 3-D TFSS square; (ii) it is difficult to de-bond the supporting plate from the released 3-D TFSS. In the case that the bonding adhesive has to be wet removed, extensive cleaning may need to be performed to prevent adhesive contaminations to the honeycomb surfaces.

Further, most of the release methods in the prior arts initiate a single separation front in the porous silicon layer at the beginning of release that propagates through the entire wafer to complete the release. In most cases, the separation front starts from the wafer perimeter and the released portion of the epitaxial silicon layer curves upward as the separation progresses towards to the wafer center. Such a release mechanism works well for a planar release, however it does not work for the 3-D TFSS release for the following reasons: (i) because of its three dimensional structural design, the early released portion of honey-comb structure can not be tilted. A slight out-of-plane curving by an external force or an intrinsic stress will have the 3-D TFSS locked into the template and prevent a full release; (ii) larger external energy/force applied unevenly to the partially released and locked-in 3-D TFSS could cause mechanical damages. Therefore, the release energy/force should be uniform and applied in a well controlled manner for the 3-D TFSS release.

It is known that the mechanical strength of porous silicon depends on the porosity of the layer, and that porous silicon mechanical strength is sufficiently lower than that of non-porous silicon. As an example, a porous silicon layer having a porosity of 50% may have a mechanical strength about one-half of that of a corresponding bulk silicon layer. When a porous silicon layer is subjected to compressive, tensile, or shearing forces, it can be fractured, collapsed, or mechanically destroyed. A porous silicon layer, which has higher porosity, can be fractured with less applied stress.

One method for collapsing the mechanically weak porous silicon layer employs injecting the porous layer with a fluid. This method not only succumbs to the difficulties of the prior art method mentioned above, but is also complex and requires precise alignment of the fluid injection nozzle with the porous silicon layer so as not to damage the thin-film layer.

In another prior art method, a process of manufacturing a SOI wafer includes separating a wafer assembly into two wafers at a fragile silicon layer containing a high amount of hydrogen. The separation energy source can be selected from a group consisting of: ultrasound, infrared, hydrostatic pressure, hydrodynamic pressure, or mechanical energy. Also, yet another prior art method applies a force to a laminating material separating a nonporous silicon and porous silicon layer to separate the two layers.

Besides succumbing to the disadvantages mentioned previously, these methods may often damage the template layer which is undesirable for releasing TFSS substrate of U.S. application Ser. No. 11/868,489. Other advantages of the present disclosure may be apparent to those skilled in the art.

SUMMARY OF THE INVENTION

The following description is not to be taken in a limiting sense, but is made for the purpose of describing the general principles of the present disclosure. The scope of the present disclosure should be determined with reference to the claims. The methods of the present disclosure substantially reduce disadvantages of prior art methods, and are intended to separate a 3-D TFSS substrate from 3-D silicon templates by fracturing a middle porous silicon layer. Further, the methods of the present disclosure aim to reduce damage to both the TFSS substrate and template while also minimizing complexity.

The present disclosure presents a method for forming a porous silicon layer on a 3-D crystalline silicon template. A thin-film semiconductor, having corresponding 3-D features to those of the template, is subsequently formed on the porous silicon layer. The porous silicon layer is then fractured, releasing TFSS substrate and template. Optional cleaning and final lift-off steps may be performed or they may be completed as part of the release step mentioned above.

The fracturing steps include methods and apparatuses which uniformly fracture the porous silicon layer eliminating the need for a supporting plate. These methods allow release steps associated with 3-D structures and features. In one such method, a large isostatic pressure source, such as a hydrostatic pressure chamber, fractures the porous silicon layer.

Another method exploits thermal conduction and expansion coefficient mismatches between porous and non-porous layers to break the porous silicon layers. Several methods will be presented that exploit the coefficient mismatches and generate thermal stresses.

Other methods of the present disclosure break the mechanically weak porous silicon layer, while leaving other layers intact, by irradiating the wafer with controlled megasonic or ultrasonic energy.

In another method of the present disclosure, a convex or concave wafer chuck mechanically bends a wafer, thereby fracturing the middle porous silicon layer.

Additionally, a thermal chemical etch process may be used to fracture the porous silicon layer. In this method, the porous silicon layer absorbs a gaseous etchant into its pores. The temperature of the etchant is increased, and subsequent etchant expansion results in a fractured porous silicon layer.

Further, a double-phase transformation processes wherein a liquid is first vaporized and then solidified may also be used to break the porous silicon layer.

These and other advantages of the disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following FIGURES and detailed description. It is intended that all such additional systems, methods, features and advantages be included within this description and within the scope of the accompanying claims.

BRIEF DESCRIPTION OF DRAWINGS

The features, nature, and advantages of the disclosed subject matter may become more apparent from the detailed description set forth below when taken in conjunction with the drawings in which like reference characters identify correspondingly throughout and wherein.

DETAILED DESCRIPTION OF THE PREFERRED EMBODIMENTS

Figure 1:
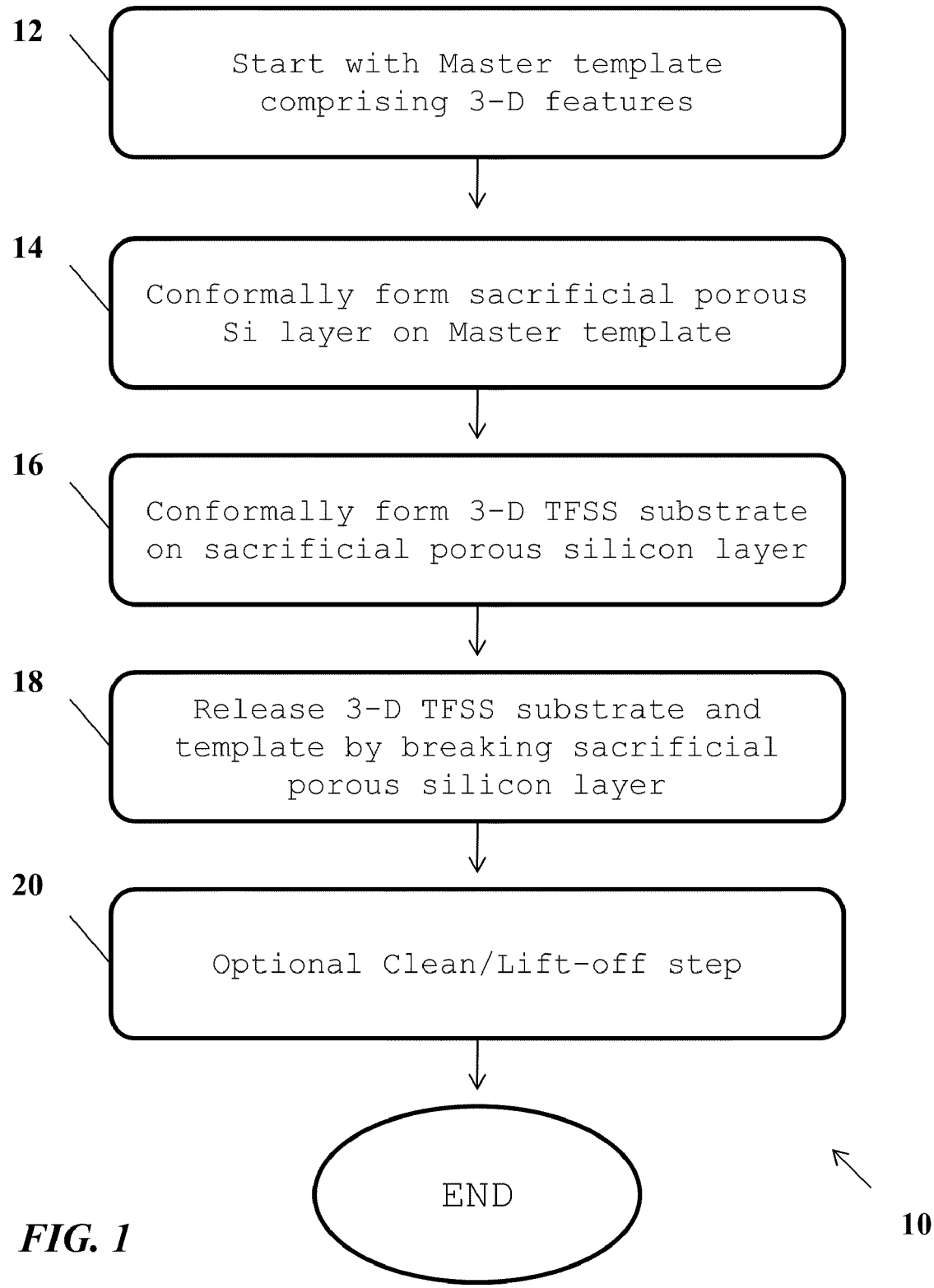
FIG. 1 shows an embodiment of a process flow for separating 3-D TFSS substrate from a 3-D crystalline silicon template.

The following description is not to be taken in a limiting sense, but is made for the purpose of describing the general principles of the present disclosure. The scope of the present disclosure should be determined with reference to the claims. And although described with reference to the manufacture and separation of three-dimensional thin-film semiconductor substrate (3-D TFSS), a person skilled in the art could apply the principles discussed herein to the manufacturing of any multi-dimensional substrate.

Preferred embodiments of the present disclosure are illustrated in the drawings, like numbers being used to refer to like and corresponding parts of the various drawings. The innovative 3-D TFSS substrate designs and technologies of the current disclosure are based on the use of a three-dimensional, self-supporting, semiconductor thin film, deposited on and released from a reusable crystalline (embodiments include, but are not limited to, monocrystalline or multicrystalline silicon) semiconductor template, and methods for separating a reusable crystalline semiconductor template and 3-D TFSS substrate.

A preferred semiconductor material for the 3-D TFSS is crystalline silicon (c-Si), although other semiconductor materials may also be used. One embodiment uses monocrystalline silicon as the thin film semiconductor material. Other embodiments use multicrystalline silicon, polycrystalline silicon, microcrystalline silicon, amorphous silicon, porous silicon, and/or a combination thereof. The designs here are also applicable to other semiconductor materials including but not limited to germanium, silicon germanium, silicon carbide, a crystalline compound semiconductor, or a combination thereof. Additional applications include copper indium gallium selenide (CIGS) and cadmium telluride semiconductor thin films.

Further, separation methods disclosed are intended to release a 3-D TFSS substrate from reusable crystalline silicon template through the use of a buried porous silicon layer. In particular, these methods fracture or break the buried porous silicon layer without damaging either the 3-D TFSS or reusable crystalline template. Additionally, a final lift-off or cleaning step may be applied to both the 3-D TFSS and reusable crystalline silicon template to diminish porous silicon residue on these layers. Although the separation methods of the present disclosure fracture a buried porous silicon layer to separate a 3-D TFSS substrate and a reusable crystalline silicon template, they may be used to separate any two layers, 3-D or planar, separated by a mechanically weak buried layer.

FIG. 1 shows example process flow 10 which realizes, at least partially, the embodiments of the present disclosure. Process flow 10 may be used to process one or more wafers at a time depending on cost, time, quality, and complexity considerations.

In step 12, a patterned 3-D template is provided. Step 14 of FIG. 1 involves forming a thin porous silicon sacrificial layer on template deep trenches (trench sidewalls and bottoms) using electrochemical hydrofluoric (HF) etching (also known as electrochemical anodization of silicon). The porous silicon layer may be formed by one of two primary techniques as follows: (i) deposit a thin conformal crystalline silicon layer (in one embodiment, a p-type boron-doped silicon layer in the range of 0.2 to 2 microns) on an n-type template substrate, using silicon epitaxy, followed by conversion of the p-type epitaxial layer to porous silicon using electrochemical HF etching; or (ii) convert a thin layer of the template substrate (in one embodiment, a p-type template) to porous silicon (in one embodiment, in the thickness range of 0.01 to 1 micron). The sacrificial porous silicon formed by one of these two techniques also serves as a seed layer for subsequent epitaxial silicon deposition of step 16.

TFSS substrate layer formation step 16 involves performing a hydrogen bake (at 950° to 1150° C.) to clean the surface and to form a continuous sealed monocrystalline surface layer on the surface of the porous silicon sacrificial layer, followed by depositing a blanket layer of doped silicon epitaxy (top only) in an epitaxial processing reactor. In one embodiment, the layer is p-type, boron-doped and has a thickness between 1 and 30 microns.

One aspect of the present disclosure concerns itself with improvements to release step 18 of FIG. 1. Improvements to release step 18 include minimal damage to TFSS substrate and template, ability to process 3-D features, and reduced need for a bonding plate traditionally used in the release process. These improvements follow from the methods and apparatuses to be described. Step 18 involves breaking the buried porous silicon layer to separate TFSS substrate and template. To facilitate complete porous silicon fracturing, step 18 may be repeated as necessary. Step 20 of FIG. 1 involves an optional lift-off step wherein the TFSS substrate and template are completely separated after porous silicon breaking step 18. In addition, step 20 could involve an optional cleaning step which removes porous silicon residue created on the TFSS substrate and the template by breaking step 18. Further, step 20 may be combined with step 18 to reduce processing time, cost, and complexity. Thus, process flow 20 produces an undamaged TFSS substrate and minimizes damage to the template.

Figure 2:
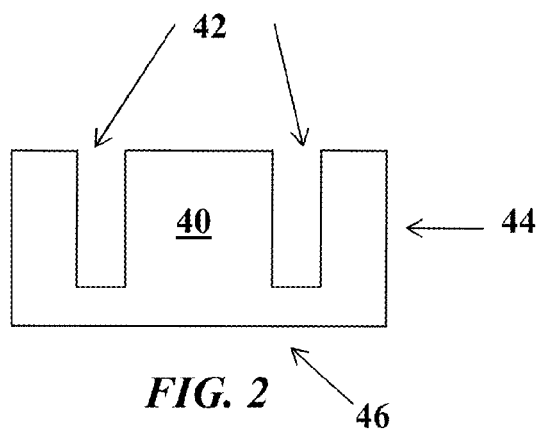
FIGS. 2 through 6 show illustrative examples of the steps shown in the method of the present disclosure.
Figure 3:
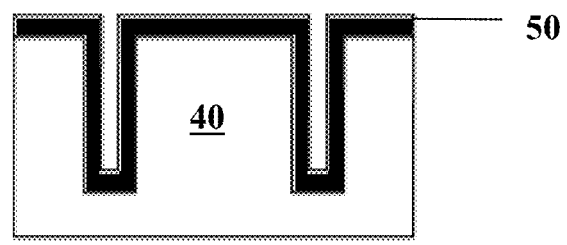
Figure 4:
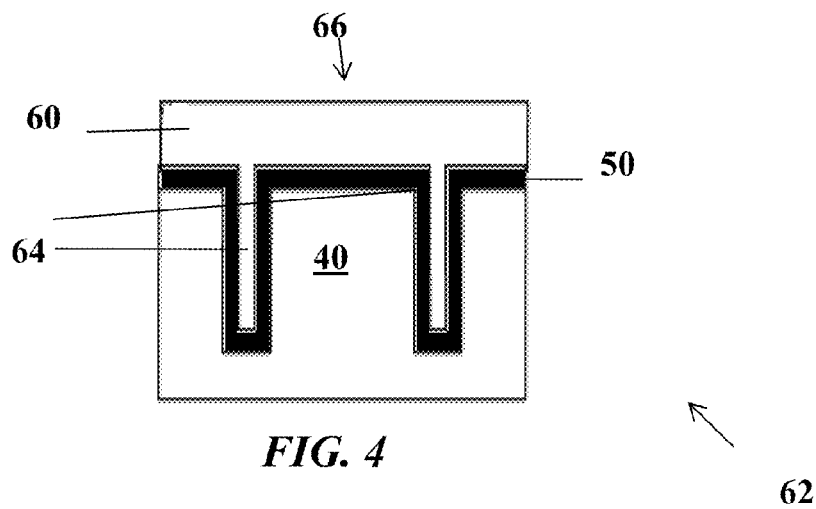

FIGS. 2 to 6 provide illustrative examples of process flow 10 (FIG. 1). FIG. 2 corresponds to step 12 of FIG. 1 and shows reusable crystalline silicon template 40. Template 40 comprises base 46, sidewalls 44, and 3-D features 42. The methods and apparatuses of the present disclosure minimize damage to template 40. FIG. 3, corresponding to step 14 of FIG. 1, shows porous silicon layer 50 formed conformal to template 40. FIG. 4 illustrates TFSS substrate 60 of step 16 (FIG. 1). TFSS substrate 60 comprises reverse 3-D features 64 of template 40, and may comprise base 64.

The term "Wafer" will be used to describe structure 62 herein, comprising buried porous silicon layer 50, template 40, and TFSS substrate 60. Additionally, TFSS substrate 60 and template 40 may be jointly referred to as "non-porous Si layers" herein.

Figure 5:
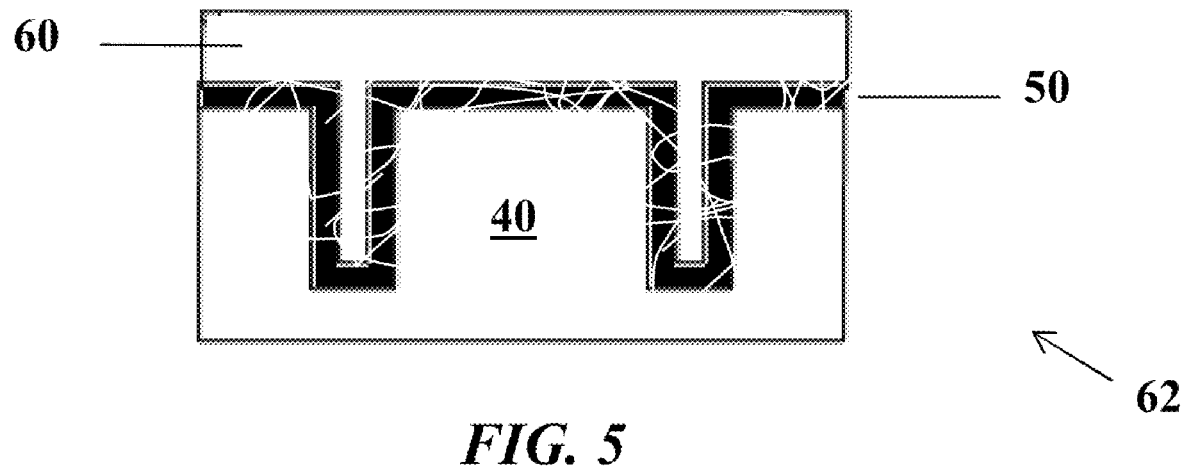
Figure 6:
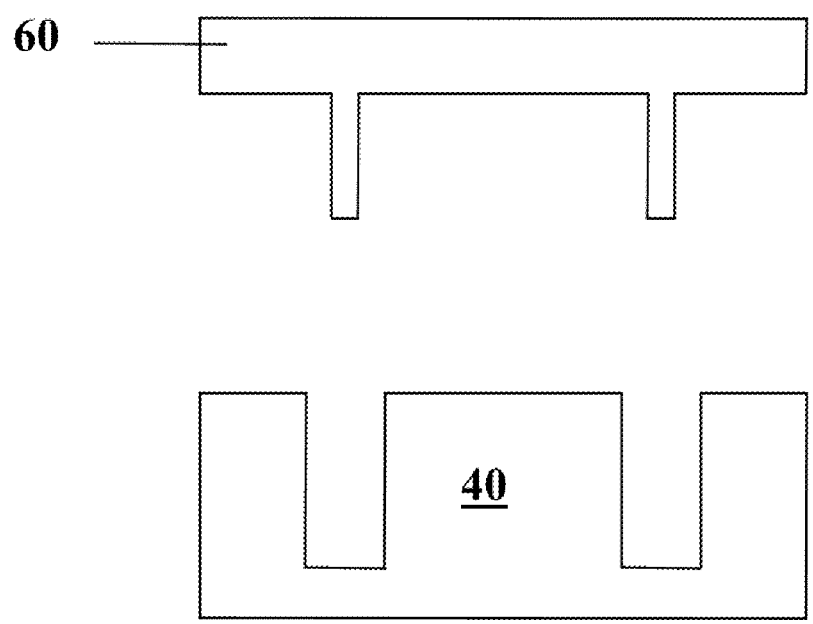

FIG. 5 corresponds to step 18 of FIG. 2. The methods and apparatuses of the present disclosure are used to break porous silicon layer 50 without damaging TFSS substrate 60 and template 40. FIG. 6 illustrates the end products, released, undamaged TFSS substrate 60 and template 40, that result from step 20 of FIG. 1.

Figure 7:
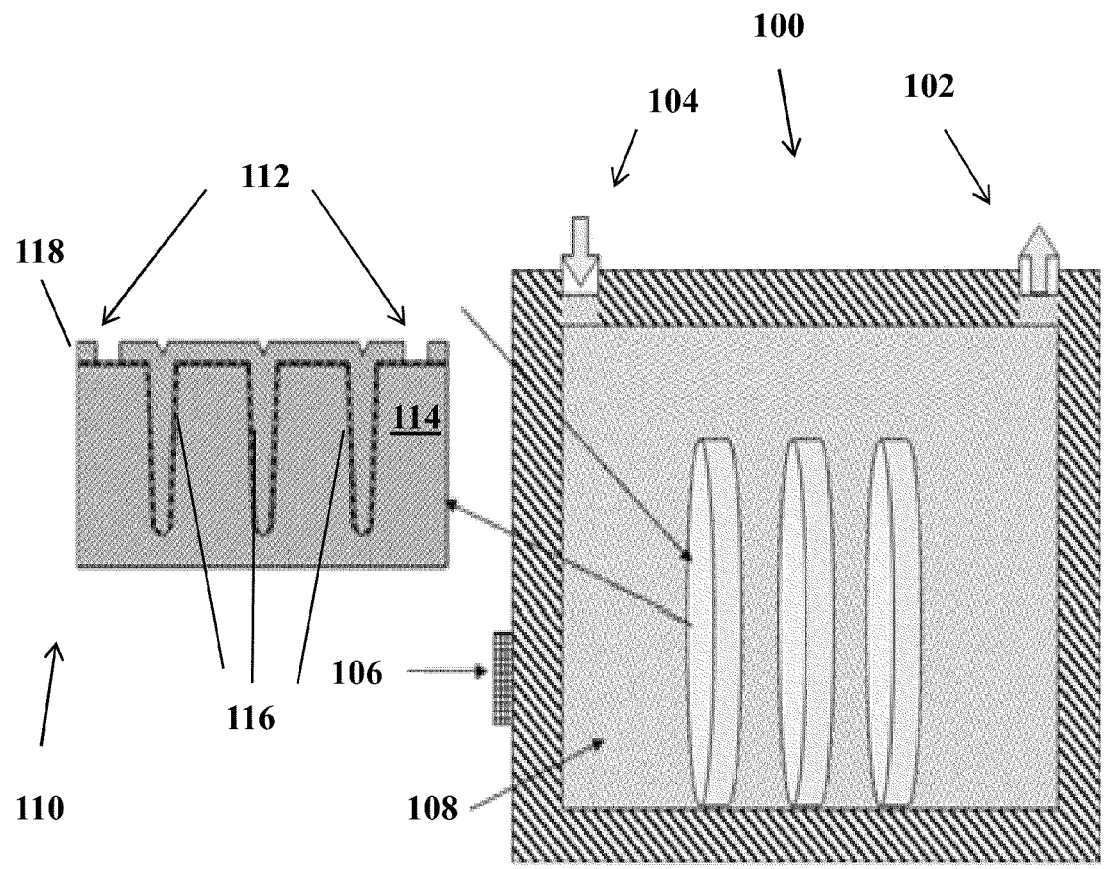
FIG. 7 presents an example of the Hydrostatic Pressure method of the present disclosure.

FIG. 7 illustrates one embodiment of release step 18 (FIG. 1) of the present disclosure. Hydrostatic pressure vessel 100 subjects wafers 110 to large (0.1 GPa to 100 GPa) isostatic pressures. Hydrostatic pressure vessel 100 comprises inlet 104, outlet 102, fluidic medium 108, and may have sonic sensor 106. Wafers 110 comprise trenches 112 which ease lift-off step 20 of FIG. 1.

As shown in FIG. 7, wafers 110 to be released are loaded in hydrostatic pressure vessel 100. Fluidic medium 108 may comprise materials such as compressed air, liquid nitrogen, inert gases, or inert liquids. Controls regulate the temperature and pressure of fluidic medium 108.

Figure 8:
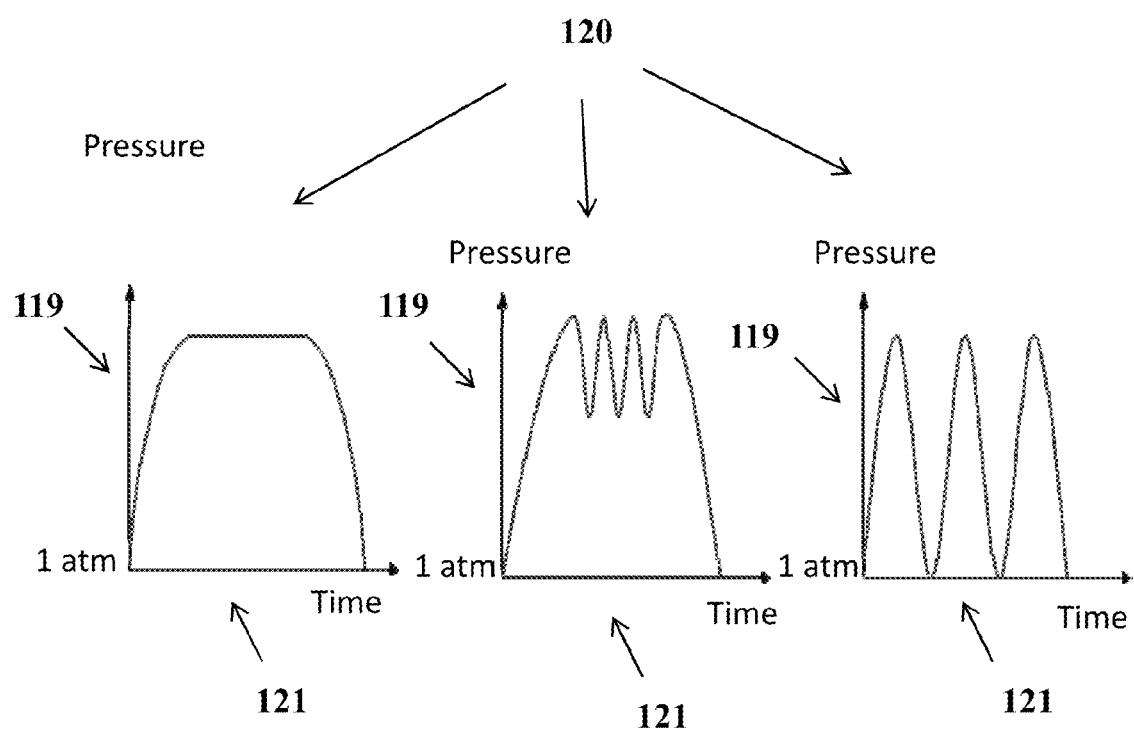
FIG. 8 shows examples of Hydrostatic Pressure cycles that may be used with the Hydrostatic Pressure method of the present disclosure.

FIG. 8 illustrates examples of pressure waveforms 120 which may be used to fracture the buried porous silicon layer. FIG. 8 shows the waveforms in terms of y-axis 119 representing pressure in atm and x-axis 121 representing time.

Hydrostatic pressure, in the range of 0.1 to 100 GPa, applied for a short time, such as a few minutes, breaks buried porous silicon layer 116 of FIG. 7. Controlled pressure value variations and cycling can be applied as needed. After the pressure is released, one high pressure treatment cycle is completed which could be repeated multiple times in order to fracture porous silicon layer 116 partially or completely. Then, wafers 110 are unloaded and moved to final release step 20 of FIG. 1. Referring back to FIG. 7, Sonic sensor 106, attached to Hydrostatic pressure vessel 100 chamber wall or inner chamber space, detects porous silicon layer 116 collapse point (end point detection). Sonic sensor 106 may be implemented in a feedback loop controlling process parameters including pressure, time, temperature, and number of cycles. Extreme, instantaneous, and isostatic pressures make the hydrostatic pressure treatment of FIG. 7 a particularly attractive solution to current release problems.

Studies conducted in the past show mechanical properties of thin porous silicon layers including fracture strength, toughness, and elasticity are key process parameters. Further, not all porous silicon microstructures experience compressive stress as a result of hydrostatic pressure applied to the non-porous layers. Porous silicon on trench 112 sidewalls experiences both shear and compressive stresses at the same time. This combination of mechanical stresses effectively fractures local porous silicon layers without higher pressure. Also, reduced pressure levels caused by a combination of mechanical stresses mitigate damage to the non-porous silicon layers. A high porosity (50%-70%), heavily doped p++ porous silicon layer is preferred.

Additionally, the hydrostatic pressure method of FIG. 7 may be combined with other release method such as the ultrasonic wave energy method to be described later in the present disclosure. After the porous silicon layers inside the trench regions are fractured by the hydrostatic pressure, the ultrasonic method, which is described in the later section, will be more effective in fully fracturing the remaining porous silicon layers.

In another embodiment of the present disclosure, selectively heating the buried porous silicon layer generates thermal stresses which fracture the porous silicon layer and release the non-porous silicon layers. The following methods rely on the thermal conduction mismatch and thermal expansion/contraction coefficient mismatch of porous silicon and the non-porous silicon layers. Heating the wafer causes these mismatches to create shear stresses along the porous silicon and non-porous silicon interfaces as well as within the porous silicon layer. Thus, heating fractures the porous silicon layer once shear stresses exceed a critical value. The collapse of the porous silicon layer allows release of 3-D TFSS substrate and 3-D template. Further, controlling temperature and processing time fully fracture the buried porous silicon layer and reduce damage to the TFSS substrate and template.

Figure 9:
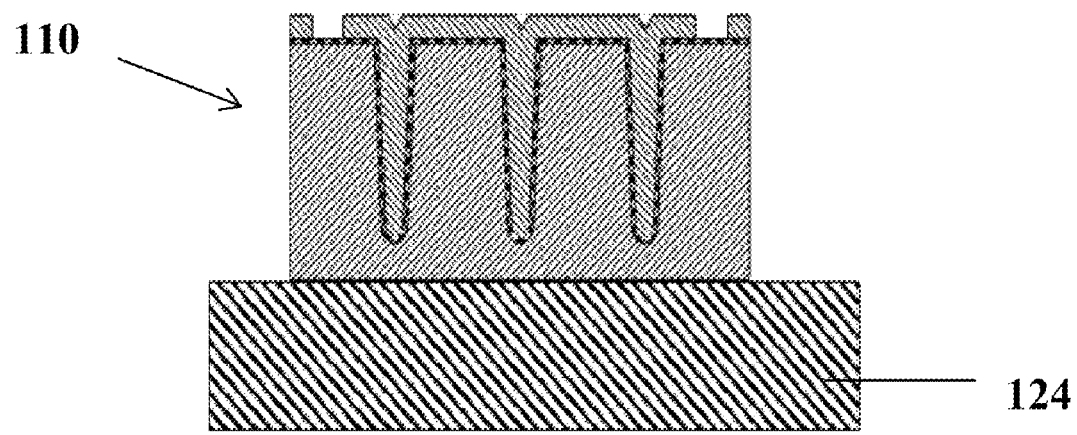
FIG. 9 illustrates an embodiment for separating a 3-D TFSS substrate from a crystalline template by thermally fracturing a porous silicon layer through the use of a temperature controlled wafer chuck.
Figure 10:
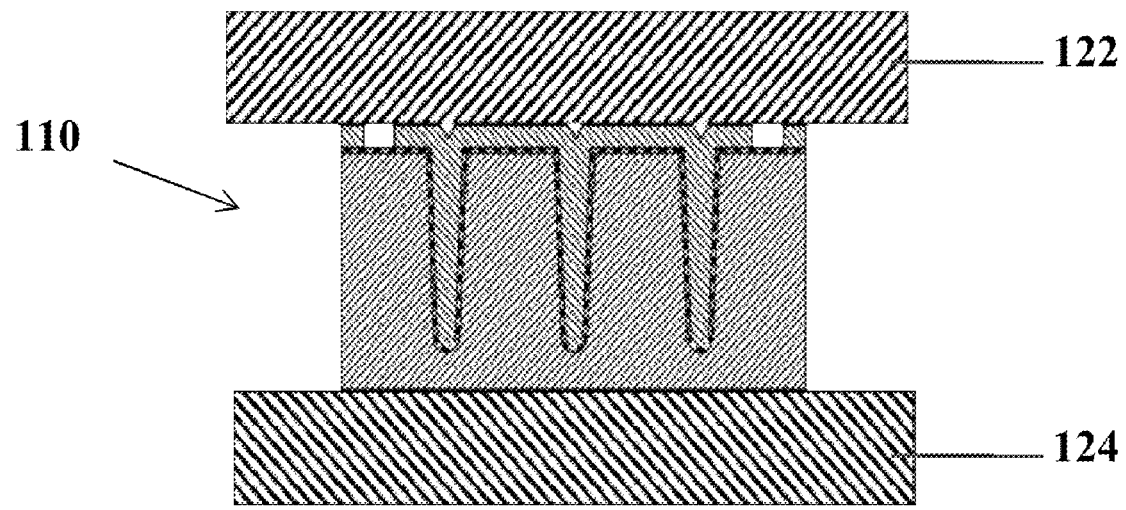
FIG. 10 illustrates an embodiment for separating a 3-D TFSS substrate from a crystalline template by thermally fracturing a porous silicon layer through the use of temperature controlled wafer chucks.
Figure 11:
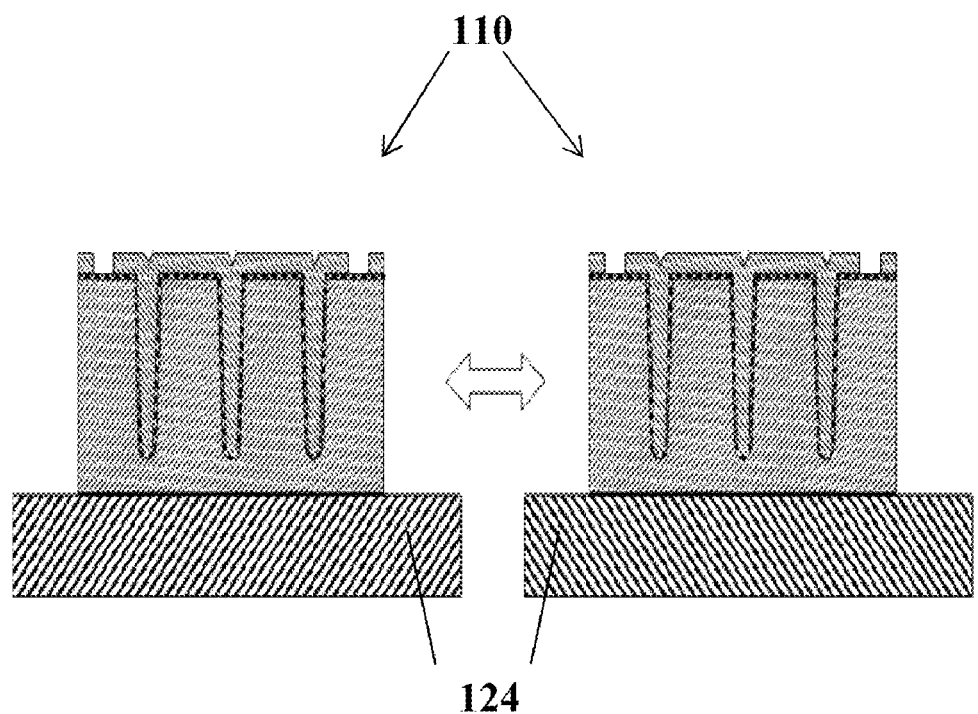
FIG. 11 illustrates an embodiment for separating a 3-D TFSS substrate from a crystalline template by thermally fracturing a porous silicon layer through the use of temperature controlled wafer chucks.

The embodiments of FIGS. 9 through 11 heat or cool a wafer by contacting the wafer to a temperature controlled chuck. A highly porous (50%-70%), heavily doped p++ porous silicon layer is preferable for these embodiments.

FIG. 9 illustrates one method for generating thermal stresses and fracturing porous silicon, thereby realizing step 18 of FIG. 1. Temperature controlled chuck 124 secures wafer 110. Temperature controlled chuck 124 is preferably made by metal and maintains a pre-set temperature in the range of −50° C. to 350° C. Electrostatic or vacuum chucking could be used for securing wafer 110 to temperature controlled chuck 124's surface. The contacting time could be from tens of seconds to a few minutes. The epitaxial silicon side could be either facing up or facing down as needed. After unloading the wafer from the plate, the wafer is allowed to return to room temperature preferably in a few minutes. This process could be repeated for a multiple controlled cycles as necessary.

FIG. 10 shows another embodiment using two temperature controlled wafer chucks. Chuck 124, maintained at a pre-set temperature in the range of 50° C. to 350° C., secures wafer 110. After an initial contacting time from tens of seconds to a few minutes, chuck 122 contacts wafer 110's exposed surface. Chuck 122 is set at a different temperature than chuck 124's. Chuck 122 may be set at a temperature in the range of −50° C. to 0° C. The TFSS substrate may contact either chuck. After a thermal treatment time from tens of seconds to a few minutes, chuck 122 is removed followed by the removal of wafer 110 from chuck 124's. The method of FIG. 10 could be repeated for as many cycles as necessary. Sandwiching wafer 110 between chucks 122 and 124, set at sufficiently differing temperatures, creates stronger temperature gradients than the method of FIG. 9. Although the chucks are preferably set in the range of −50° to 0° C. and 50° to 350° C., any temperature difference sufficient to fracture the porous silicon layer is acceptable.

FIG. 11 shows yet another embodiment of FIG. 9. Wafer 110 is alternately placed on chucks 124 with different temperature settings. One chuck is heated and the other chuck is cooled and they are maintained at pre-set temperatures in the range of −50° C. to 350° C. Chucks 124 are preferably made from metal. However, other materials which are reasonable efficient at conducting heat could be used. Electrostatic or vacuum chucking could be used for securing wafer 110 to chucks 124's surfaces. The contacting time could be from tens of seconds to a few minutes. The TFSS substrate layer could be either facing up or facing down as needed. The hot and cold contact duty cycles are controlled. The controls are preferably programmable so that the process could be repeated for multiple cycles as necessary. Any temperature difference between the two chucks suitable to fracture the porous silicon layer is suitable.

Figure 12:
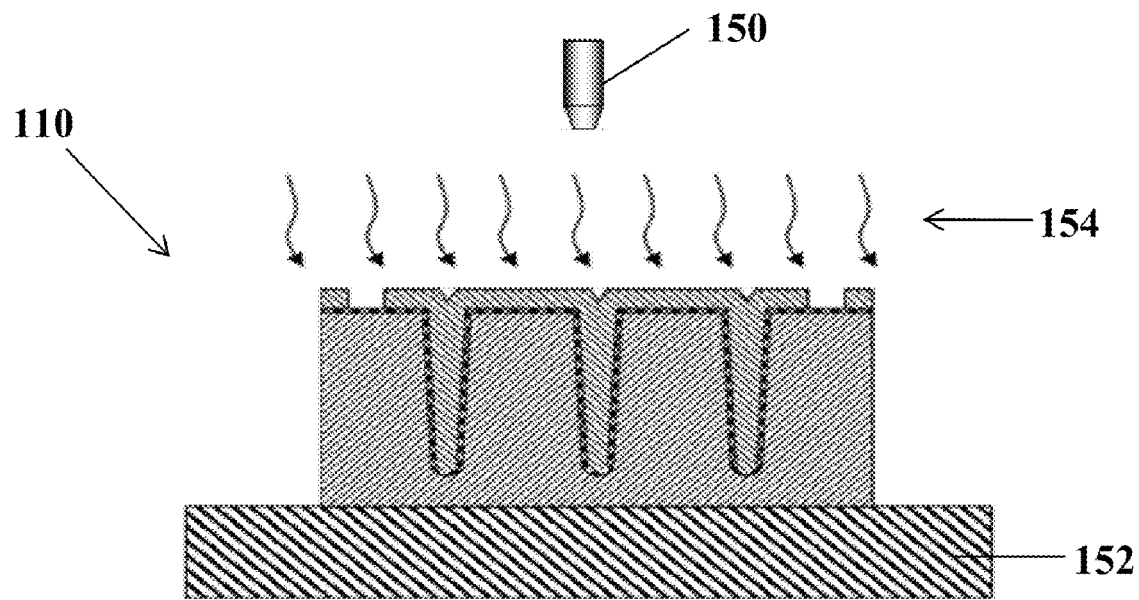
FIG. 12 illustrates an embodiment for separating a 3-D TFSS substrate from a crystalline template by thermally fracturing a porous silicon layer through the use of a rapid thermal processor.

FIG. 12 illustrates another embodiment of the present disclosure which fractures the buried porous silicon layer by generating thermal stresses. FIG. 12 corresponds to step 18 of FIG. 1. Chuck 152 is made of a heat insulating material, such as ceramic, and secures wafer 110. Lamp-heated rapid thermal processor (RTP) system 150 applies radiated heat 154 to wafer 110's surface. Wafer 110 could reach temperatures up to 800° C. In one embodiment of FIG. 12, lamp-heated RTP system 150 heats wafer 110 between cycles of edge-hot/ center-cold and edge-cold/center-hot. The lateral temperature gradient fractures porous silicon microstructures efficiently. The TFSS substrate side could be facing up or facing down as needed. This process could be repeated for multiple controlled cycles as necessary.

Figure 13:
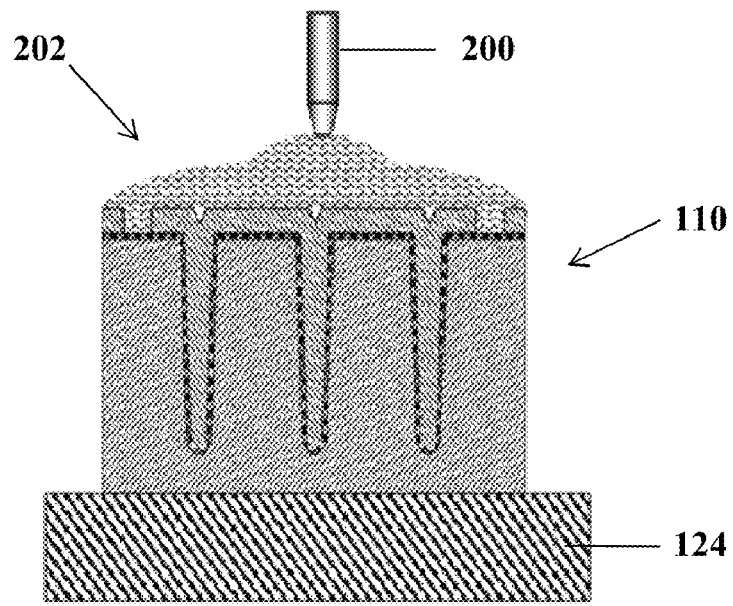
FIG. 13 illustrates an embodiment for separating a 3-D TFSS substrate from a crystalline template by thermally fracturing a porous silicon layer through the use of a dispensing system.

In another embodiment of step 18 of FIG. 1, FIG. 13 illustrates a dispensing method for generating thermal stresses. Chuck 124 secures wafer 110 to its surface. Dispense system 200 discharges heating or cooling source 202 on wafer 110's top surface. Dispense time ranges from a few seconds to a few minutes. If cooling source 202 is discharged, chuck 124 maintains a pre-set temperature in the range of 20° C. to 350° C. Dispensed cooling sources 202 could include, but are not limited to, liquid nitrogen, other liquids of inert gases, cold air, or $CO_2$ snow. If heating source 202 is discharged, chuck 124 maintains a pre-set temperature in the range of −50° C. to 20° C. Dispensed heating sources 202 could include, but are not limited to, hot de-ionized (DI) water, hot steam, or hot air. Any temperature of chuck 124 that is sufficient to the fracture porous silicon layer while dispensing heating or cooling source 202 is acceptable.

In one embodiment of FIG. 13, chuck 124 rotates in the range of 10 rpm to 500 rpm. Heating or cooling source 202 dispense rate, dispense amount, dwell time, and wafer 110 re-cooling or re-heating time are controlled in order to repeat this process for multiple controlled cycles as necessary. TFSS substrate could be facing up or down as needed. Dispensing system 200 comprises a nozzle with one or more holes. A dispense nozzle comprising multiple holes, such as a dispensing shower-head, discharges heating or cooling source 202 more uniformly on wafer 110's surface.

Figure 14:
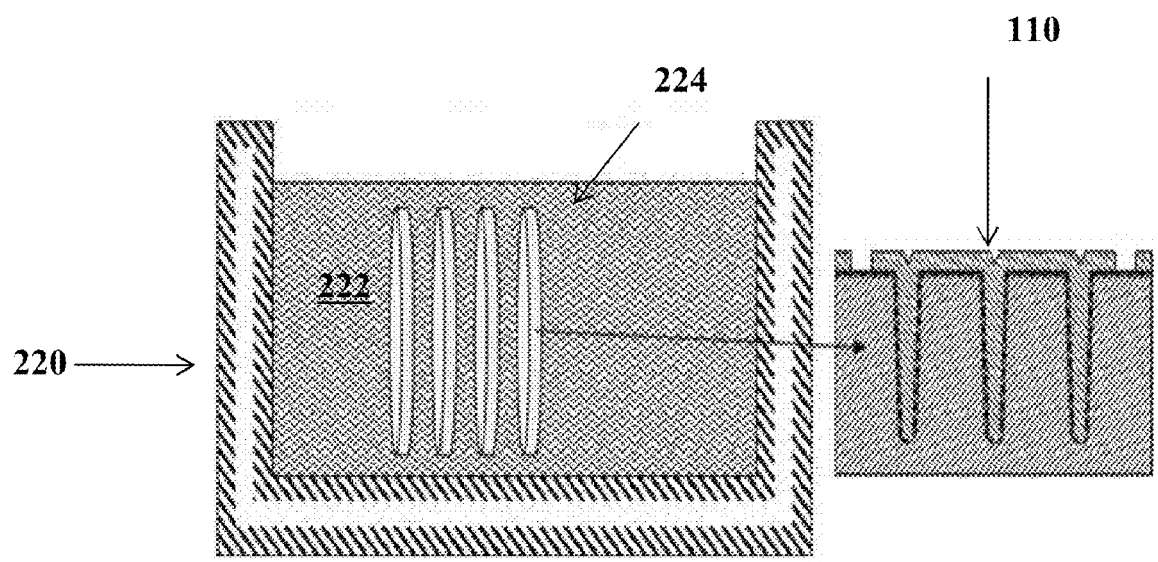
FIG. 14 illustrates an embodiment for separating a 3-D TFSS substrate from a crystalline template by thermally fracturing a porous silicon layer through the use of an immersion or convection process.

FIG. 14, corresponding to release step 18 of FIG. 1, shows another embodiment of the present disclosure wherein thermal stresses are used to fracture the porous silicon layer. Wafer 110 or a batch of wafers 224 are immersed in heating or cooling source 222 contained in tank 220. Cooling source 222 could comprise a liquid or gas, preferably liquid nitrogen. Loading speed, loading time, and immersion time should be controlled. The controls are preferably programmable so that the process could be repeated for multiple cycles as necessary. In another embodiment, tank 220 may comprise a temperature controlled oven. Wafers 110 may be loaded into tank 220 and convection may be used as the thermal stress generation process.

Figure 15:
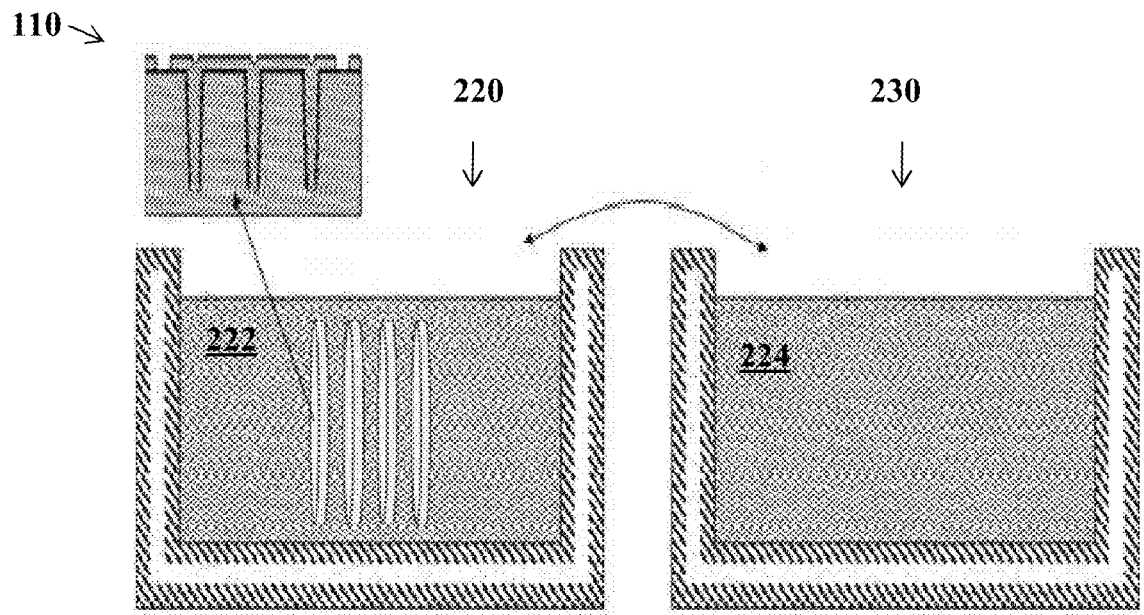
FIG. 15 illustrates an embodiment for separating a 3-D TFSS substrate from a crystalline template by thermally fracturing a porous silicon layer through the use of an immersion or convection processes.

FIG. 15 illustrates another embodiment of FIG. 14. A single or batch immersion process immerses wafer 110 in tank 220 containing cooling or heating source 222. Then wafers 110 are transferred to heating or cooling tank 230. One tank contains a heating source and the other a cooling source. The motion of loading wafers 110 from tank 220 to tank 230 is preferably controlled in terms of loading speeds and time. Multiple wafers could be loaded at one time. Further, Programmable controls monitor and manipulate immersion duty cycles associated with tanks 220 and 230.

Figure 16:
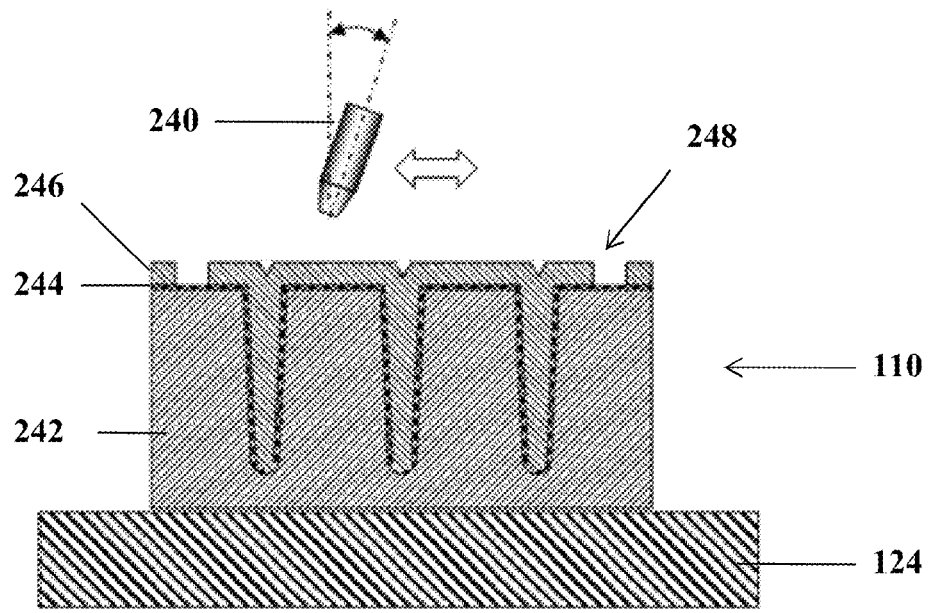
FIG. 16 illustrates an embodiment for separating a 3-D TFSS substrate from a crystalline template by thermally fracturing a porous silicon layer through the use of selective IR radiation absorption.

In another embodiment of the present disclosure, IR laser irradiation releases a 3-D TFSS substrate from a reusable crystalline silicon template. FIG. 16 illustrates the embodiment and corresponds to step 18 of FIG. 1. Chuck 124 secures wafer 110 to its surface, and laser 240 irradiates wafer 110's surface. Wafer comprises TFSS substrate layer 246, porous silicon layer 244, template layer 242, and release trenches 248. The embodiment of FIG. 16 employs selective absorption of IR radiation to generate thermal stresses in porous silicon layer 244. TFSS substrate 246 and template 242 absorb IR radiation (wavelength>1.1 μm) poorly, but porous silicon layer 244 absorbs IR radiation much more efficiently. This is true especially when the porous silicon layer is preferably heavily doped with boron and becomes a p++ porous silicon layer.

The embodiment of FIG. 16 may be further enhanced by a pre-treatment, prior to TFSS substrate formation, of porous silicon layer 244. A suitable material (preferably $H_2O$ from anodic etching) absorbed in the pores and pore surfaces enhances IR absorption. Further, IR-laser induced etching/ vaporization of the silicon pores could be realized. When IR laser 240 wavelength and other parameters are properly selected, the laser energy is selectively absorbed in porous silicon layer 244 and converted into thermal energy, which generates a series of local effects such as thermal expansion, melting, vaporization and local shock waves within porous silicon layer 244 and along its interfaces to the non-porous silicon layers 242 and 246. While IR laser 240 heats porous silicon layer 244, non-porous silicon layers 242 and 246 are only slightly heated or not at all. As a result of these selective effects, porous silicon layer 244 is fractured or destroyed.

Carbon dioxide ($CO_2$), continuous-wave or pulsed-wave, lasers have a wavelength of 10.6 μm and are suitable for this application. Pulsed wave lasers generate pulsed thermal shocks to the porous silicon layer, while minimizing heating of non-porous silicon layers, more efficiently than continuous-wave lasers; thus, pulsed wave lasers are more suited to applications of the present disclosure. As an example, a pulsed transversely excited atmospheric (TEA) $CO_2$ laser is an effective $CO_2$ laser that can generate short intense pulses with pulse energies ranging from the millijoule region to 500 Joules at pulse repetition rates from about 300 Hz down to single shot. Other suitable lasers may also be used.

Referring to FIG. 16, chuck 124 secures wafer 110 on its surface, and laser 240 scans across wafer 110's surface. Controlled motions of an x-y stage or a mirror could realize laser beam scanning. However, other scanning apparatuses could also be employed. The laser beam could be focused to the porous silicon layer or unfocused in order to gain a larger spot size. The incidence angle of the laser beam with respect to wafer 110's surface may be 0°-45° for processing porous silicon 242 on the lateral surfaces as well as other angles for effectively processing porous silicon 242 on sidewall surfaces.

Figure 17:
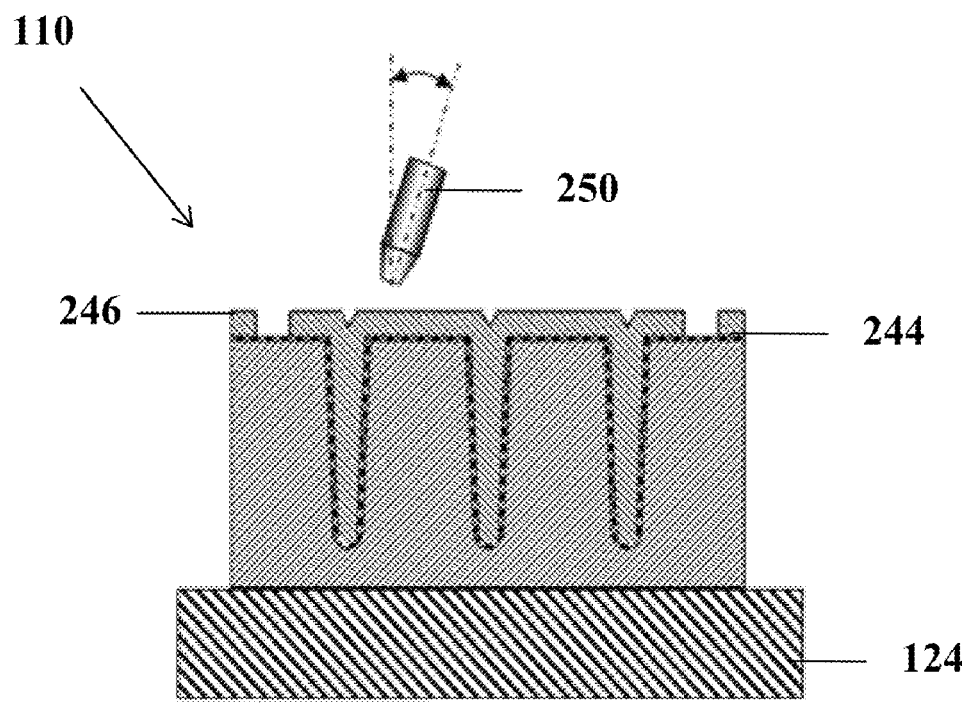
FIG. 17 presents a method for separating a 3-D TFSS substrate from a crystalline template by mechanically fracturing a mechanically weak layer using ultrasonic or megasonic energy.

The IR laser irradiation method of FIG. 17 is not limited to $CO_2$ lasers. Other IR lasers, such as YAG (1.06 um) laser could also be used. In addition, the laser irradiation process performed in air with various pressures and assisting gases, or through a liquid medium such as DI water better radiates heat away from non-porous silicon layer surfaces. The previously mentioned YAG laser penetrates through water with little attenuation, making it an ideal laser for these enhancements.

Figure 18:
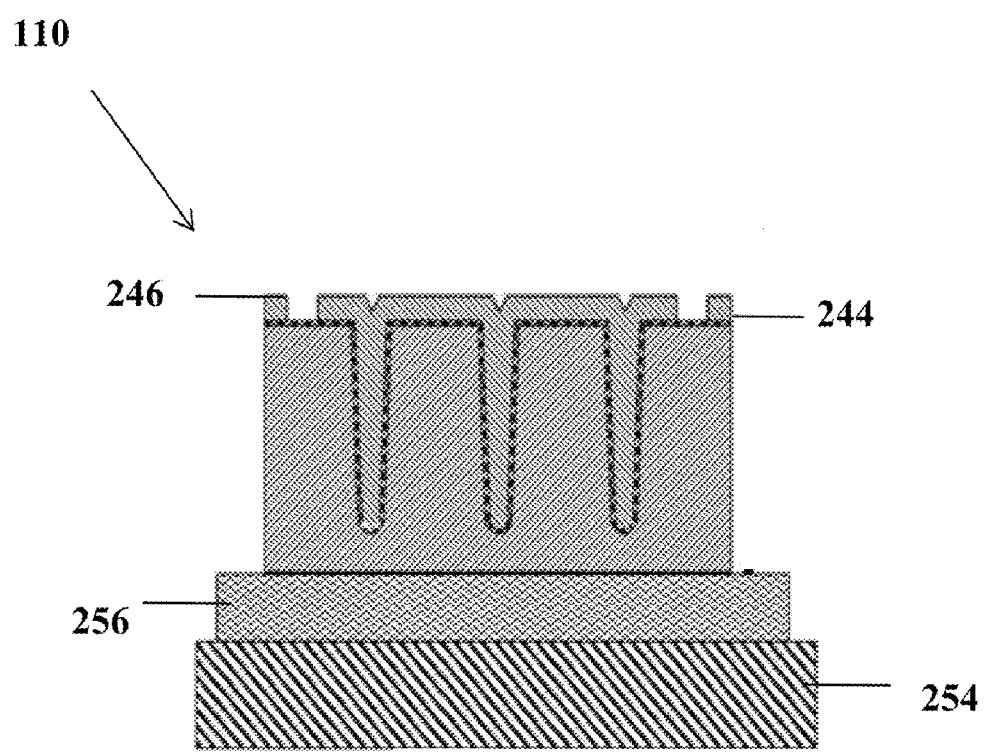
FIG. 18 presents a method for separating a 3-D TFSS substrate from a crystalline template by mechanically fracturing a mechanically weak layer using ultrasonic or megasonic energy.

FIGS. 17 and 18 show two embodiments of an ultrasonic fracturing step which corresponds to step 18 of FIG. 1. FIG. 17 shows ultrasonic probe 250 applying ultrasonic energy to wafer 110, thereby fracturing porous silicon layer 244. Wafer 110 is secured on chuck 124. Ultrasonic probe 250 scans across wafer 110's surface with controlled distance, speed, and motion. TFSS substrate layer 246 may be faced up or down as needed. FIG. 18 illustrates a different embodiment of the same ultrasonic fracturing principle illustrated in FIG. 17. An ultrasonic actuator 256, integrated with chuck 254, transmits ultrasonic energy to wafer 110, thereby fracturing porous silicon layer 244. In both cases, controlled ultrasonic waves ensure that only porous silicon layer 244 is fractured while non-porous layers 246 and 242 remain intact. Ultrasonic actuator 256, although preferably integrated with chuck 254, may be associated with the apparatus in any form that allows for efficient fracturing of porous silicon layer 244.

Figure 19:
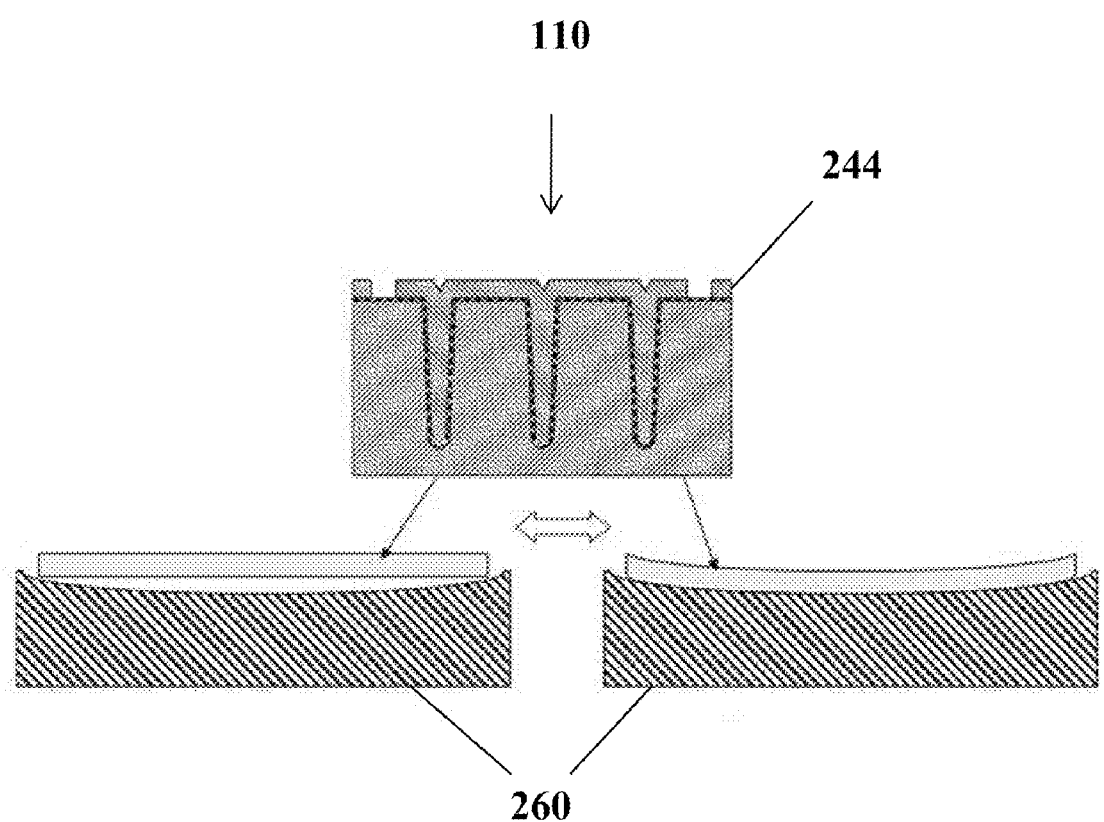
FIG. 19 presents a method for separating a 3-D TFSS substrate from a crystalline template by mechanically fracturing a mechanically weak layer through the use of a concave or convex wafer chuck.

Another embodiment of the present disclosure presents a method for mechanically fracturing the middle porous silicon layer of a wafer. This method, shown in FIG. 19, corresponds to step 18 of FIG. 1. Wafer 110 is placed on convex chuck 260. However, a wafer chuck having a concave surface is also suitable for the present applications. Chuck 260 is originally in the off position. However, once turned on chucking action of chuck 260 mechanically bends wafer 110 from center to edge. Shear, tensile, or compressive stresses induced by controlled bending of wafer 110 fracture porous silicon layer 244. The curvature of chuck 260's surface could be concave or convex, and the maximum out of plane distance from chuck 260 center to edge is in the range of 10 μm to 100 μm.

Electrostatic or vacuum chucking that has one or multiple actuation zones can be used for actuation of wafer 110 bending and actuation can be cycled in a controlled manner. In addition, wafer 110 may be heated during the bending cycling. The wafer heating source could come from an external IR heater or a heating element integrated with chuck 260. Alternatively, the wafer may be maintained at a reduced temperature during bending by dispensing a cryogenic medium, such as liquid nitrogen to the wafer 110's top surface.

Figure 20:
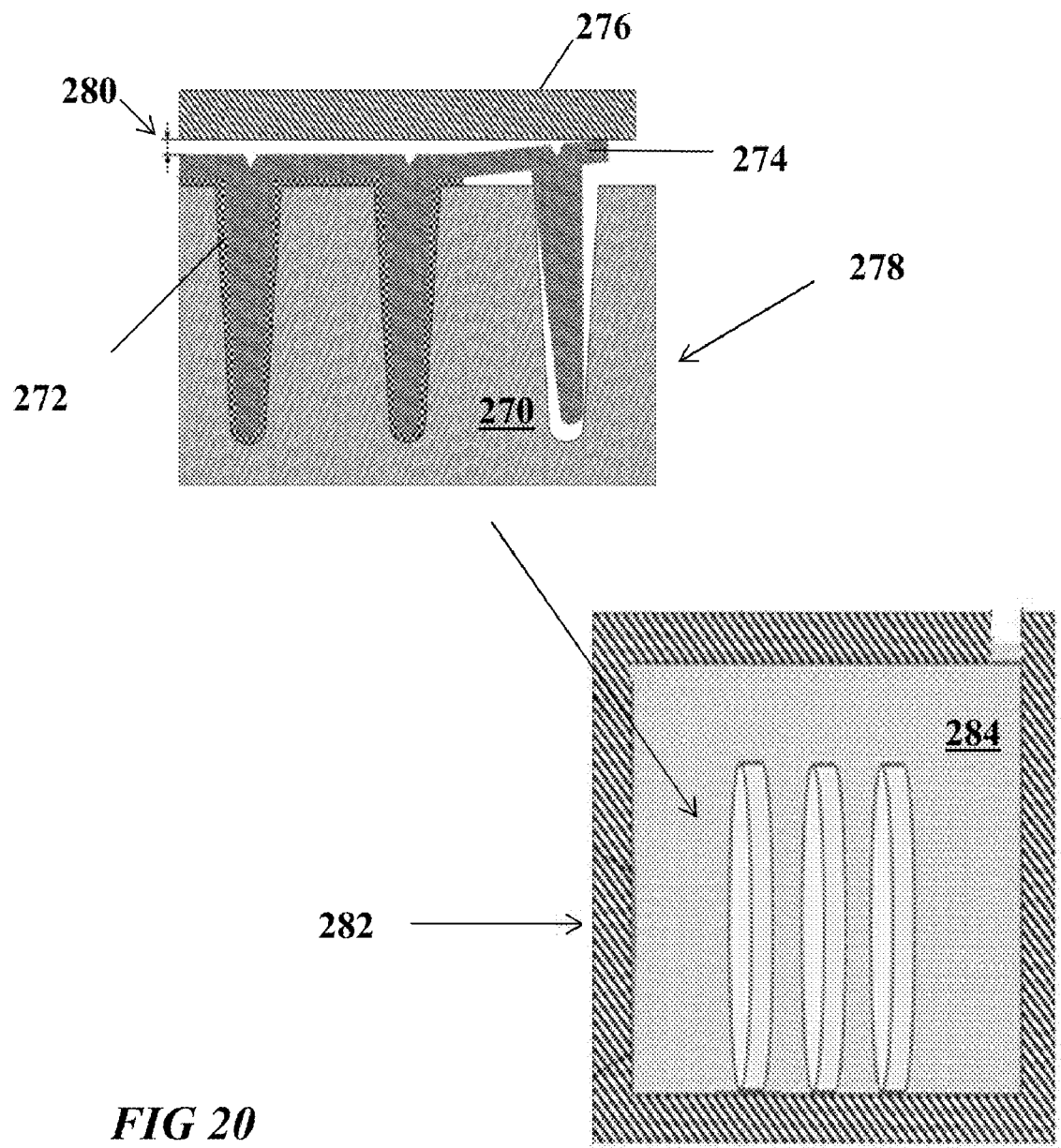
FIG. 20 presents a method for separating a 3-D TFSS substrate from a crystalline template through the use of a pressurized etching process.

Another embodiment of step 18 of FIG. 1 is illustrated in FIG. 20. Wafer 278 comprises 3-D reusable crystalline silicon template 270, porous silicon layer 272, and 3-D TFSS substrate 274. Deflection plate 276 reduces maximum out of plane deflection 280 of the wafer in the range of 5 μm to 25 μm. Wafers 278 are housed in pressure chamber 282 filled with medium 284. Etching gas 284, preferably HCl or $Cl_2$, is dispensed in pressure chamber 282.

The method of FIG. 20 employs mechanical fracturing or chemical etch of porous silicon layer 272 from wafer 278 edge to center. Since porous silicon layer 272 removal proceeds from edge to center, rather than uniformly as in the previous methods of the present disclosure, out of plane curving or displacement 280 of TFSS substrate layer 274 must be limited by deflection plate 276. Rigid deflection plane 276 placed in parallel proximity to TFSS substrate layer 274 limits out of plane deflection 280. Out of plane deflection 280 is in the range of 5 μm to 25 μm.

In the beginning of this embodiment, suitable silicon etching gas 284, such as HCl or $Cl_2$, is introduced into pressure chamber 282 that contains wafers 278. Etching gas 284 fills pores in porous silicon layer 272 from the exposed edge areas. Porous silicon layer 272 etch proceeds from wafer 278 edge to center as the temperature of pressure chamber 282 is rapidly increased. After a short time of etching, the pressure in pressure chamber 282 is quickly decreased. The rapid expansion of gases inside porous silicon layer 272 fractures thin pore walls. Repetition of this etching cycle is necessary to fully etch off and/or fracture the porous silicon layer.

Figure 21:
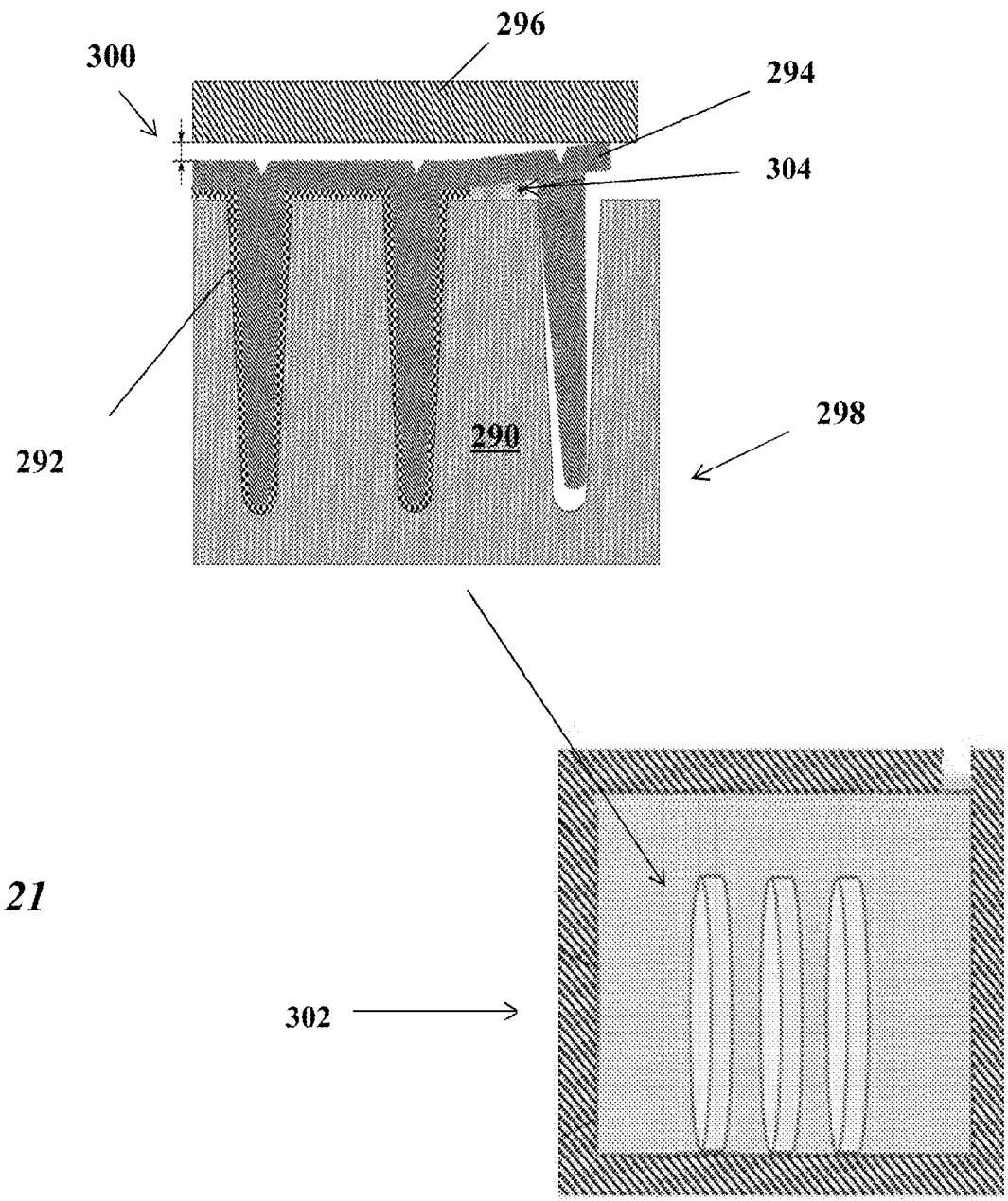
FIG. 21 presents an embodiment for separating a 3-D TFSS substrate from a crystalline template through the use of a double-phase transformation process.

FIG. 21 illustrates another embodiment of step 18 of FIG. 1. Wafer 298 comprises 3-D reusable crystalline silicon template 290, porous silicon layer 292, and 3-D TFSS substrate 294. Deflection plate 296 reduces maximum out of plane deflection 300 of wafer 298 in the range of 5 μm to 25 μm.

In the method of FIG. 21, wafer 298 is first soaked in a liquid medium, such as DI water, where the capillary forces pull water into the pores of porous silicon layer 292. Wafer 298 is transported to pressure chamber 302. Pressure chamber 302 is preferably small to facilitate rapid vacuum pumping. In one embodiment, pressure chamber 302 is connected in series with a large pre-pumped vacuum chamber (not shown). Opening a door connecting the two chambers rapidly reduces the pressure in smaller pressure chamber 302. A vacuum pump connected to the large chamber could further decrease pump down time. As a result of rapid pressure decrease, two effects occur either sequentially or simultaneously. In the first effect, water contained in porous silicon layer 292 expands by a sudden phase transformation and forms water vapor. In the second effect, the sudden water evaporation and vapor expansion cause a sudden local temperature drop, freezing the remaining water trapped in deeper pores of porous silicon layer 292. The second effect causes local volume expansion on a micro scale. As a result, formed ice 304 fractures porous silicon layer 292. Heating wafer 298 to melt ice trapped in deep pores completes one cycle of the double-phase transformation method of FIG. 21. The method may be repeated as necessary to fully fracture porous silicon layer 292. Although the preferred embodiment utilizes a connected pre-pumped vacuum chamber, any method or procedure that can facilitate rapid depressurization could be used.

The methods and apparatuses described previously effectively fracture the middle porous silicon layer. Further, they are adequate in fully releasing the TFSS substrate from the template. However, the methods to be described provide greater efficiency in separating a TFSS substrate connected to a template by a fractured porous silicon layer. The following methods relate to the final lift-off or cleaning of the TFSS substrate and template described by step 20 of FIG. 1.

Figure 22:
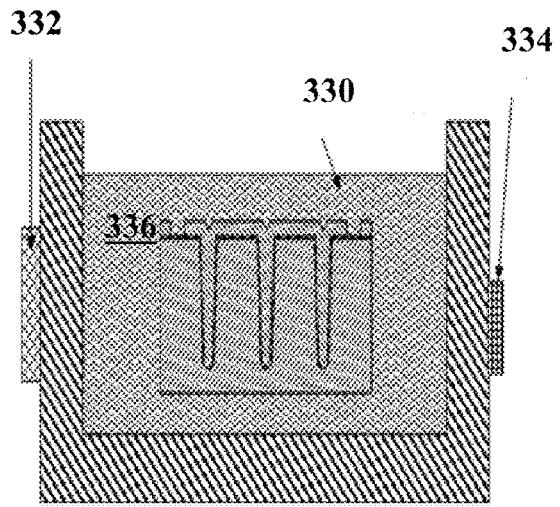
FIG. 22 presents an embodiment for separating and cleaning a 3-D TFSS substrate from a crystalline template by irradiating an immersed wafer with megasonic or ultrasonic energy.

FIG. 22 illustrates one embodiment of step 20 (FIG. 1). Ultrasonic or megasonic actuator 332 agitates liquid medium 336, irradiating wafer 330 with ultrasonic or megasonic energy. Sonic sensor 334 detects porous silicon layer collapse.

As shown in FIG. 22, wafer 330 comprising a fully or partially fractured porous silicon layer is immersed in liquid medium 336, such as DI water or IPA. Ultrasonic or megasonic actuator 332 irradiates an ultrasonic or megasonic wave in liquid medium 336. The wave energy effectively fractures the remaining porous silicon that connects or sticks to the 3-D TFSS and the template. In addition, with the agitation from the wave energy, liquid medium 336 is effectively transported into the broken porous silicon space, reducing surface forces and serving as a lubricant to reduce surface friction. Alternatively, a diluted porous silicon etchant, such as KOH or HF+H2O2 may also be used as liquid medium 336. The silicon etchant etches porous silicon along the transportation path, from edge to center, efficiently lifting-off remaining porous silicon.

Figure 23:
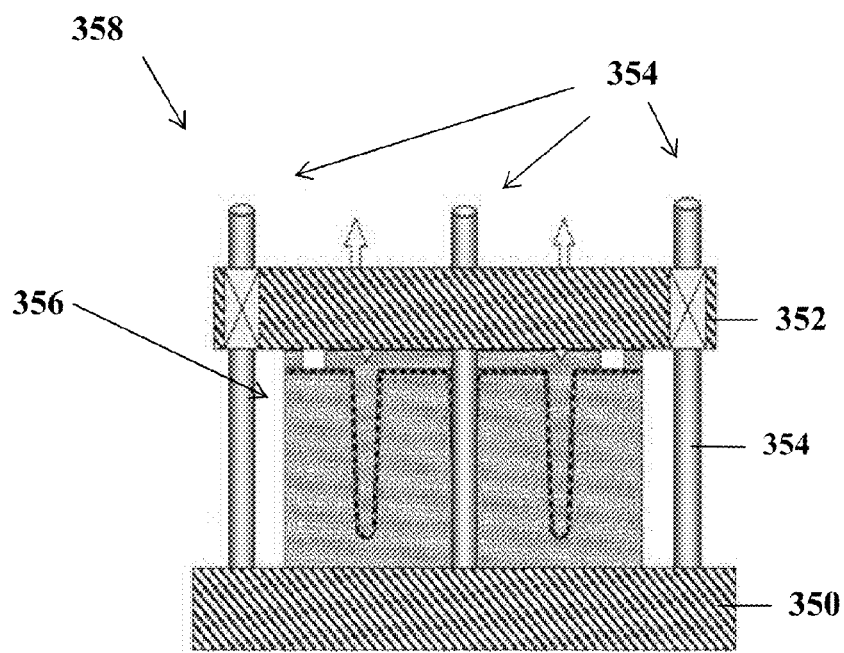
FIG. 23 presents an embodiment for separating or more fully fracturing a 3-D TFSS substrate from a crystalline template through the use of a precision mechanical pulling system.

FIG. 23 illustrates another method for effective porous silicon lift-off. FIG. 23 relates to step 20 of FIG. 1. The embodiment of FIG. 23 releases a 3-D TFSS from a reusable crystalline silicon template by precision mechanical pulling. The porous silicon layer may be fully or partially fractured by embodiments previously disclosed. Mechanical assembly 358 comprises bottom chuck 350, top chuck 352, three slider rails 354, and a large force pulling mechanism such as a motor, solenoid, or other actuators (not shown). Slider rails 354 restrict motion and keep parallelism of chucks 350 and 352 during pulling. Precision bearings (not shown) may be mounted to guide travel along the rails. Chucks 350 and 352 may use either electrostatic or vacuum chucking to secure wafer 356. Top chuck 352 preferably comprises a porous vacuum chuck to reduce alignment needs. Further, porous chucks effectively secure non-smooth surfaces. The wafer is first placed on bottom wafer chuck 350 with TFSS substrate facing upwards. After bottom chuck 350 secures the template side of wafer 356, top wafer chuck 352 is gently lowered and secures TFSS substrate side of wafer 356. The activated pulling mechanism lifts top chuck 352 upwards, and the movement is guided evenly by slider rails 354.

The methods and apparatuses described heretofore may be combined or performed separately to ensure effective fracture of the porous silicon layer, while minimizing damage to non-porous silicon layers.

The present disclosure has particular application in the fabrication of thin-film solar cells. Accordingly the following FIGS. 24 through 38B present an illustrative method and apparatus of a thin-film solar cell suitable for the disclosed methods and devices for separation. For a more detailed description of the subject matter to which the following FIGS. 24 through 38B pertain, reference is now made to co-pending U.S. patent application Ser. No. 11/868,489, entitled "METHODS FOR MANUFACTURING THREE-DIMENSIONAL THIN-FILM SOLAR CELLS," (the "'489 application") having common inventors with the present disclosure and which is here expressly incorporated by reference. Note that the following illustrative drawings and explanations derive from the '489 application and, accordingly, not all referenced items in the following figures are explained in complete detail. In the event that explanations for such reference items is desired, reference may be readily made to the '489 application.

Figure 24:
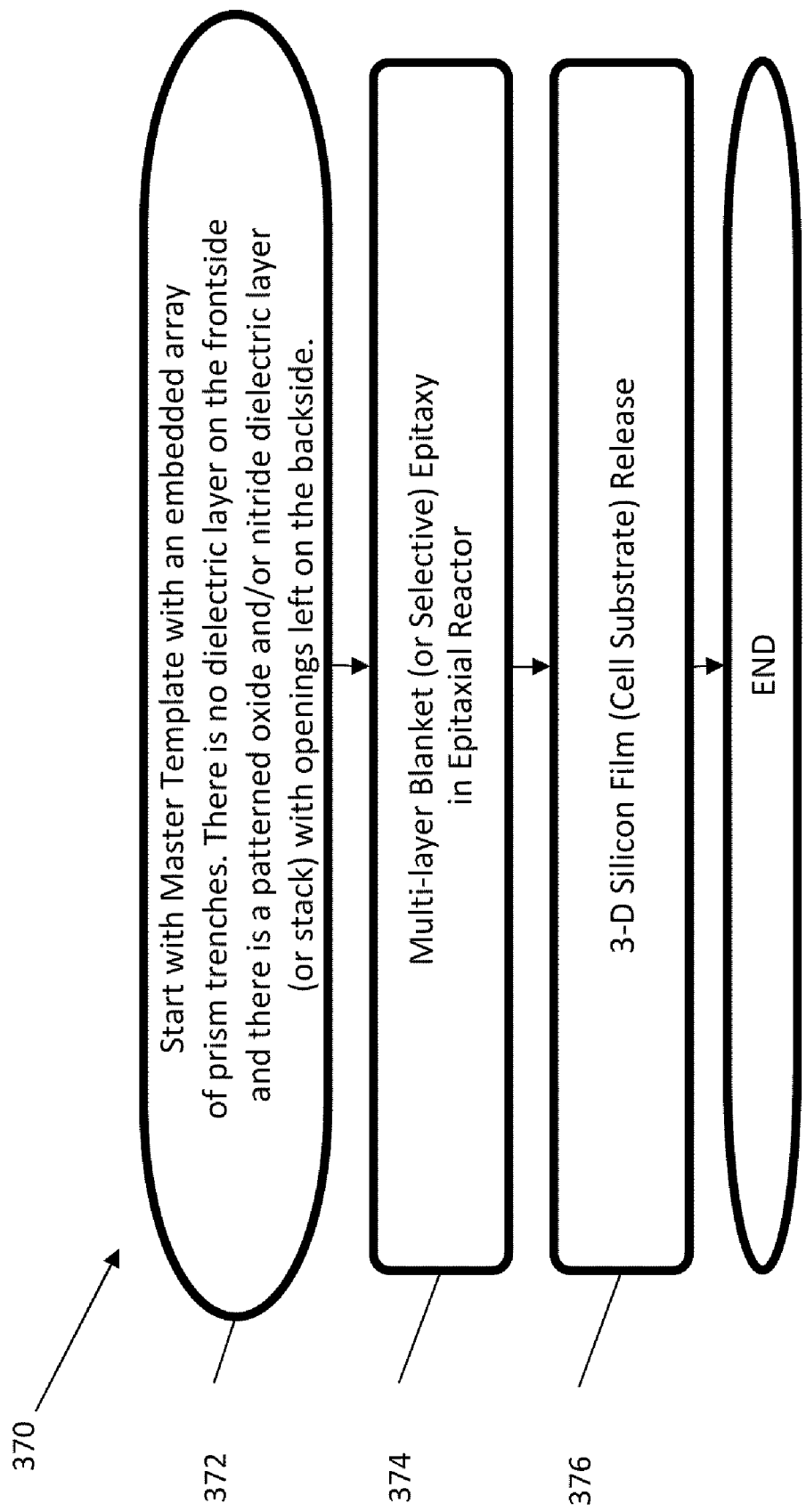
FIGS. 24 and 25 show alternative embodiments of a process flows for fabrication of self-supporting hexagonal prism 3-D TFSS substrates including rear base layers (single-aperture TFSS substrates with single-aperture unit cells)
Figure 25:
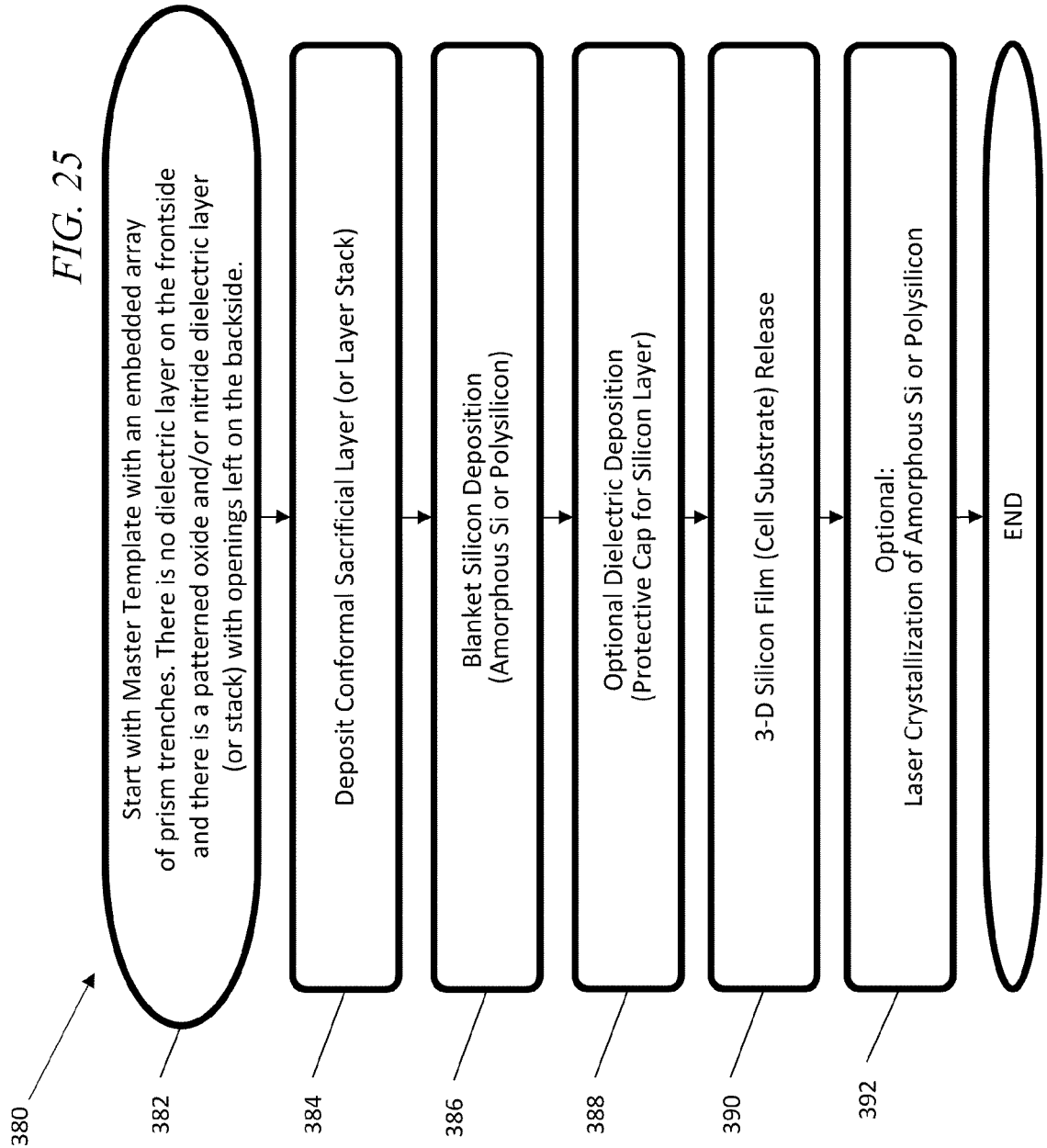

FIGS. 24 and 25 show two different process flow embodiments for fabricating hexagonal-prism dual-aperture 3-D TFSS substrates with rear base layers using a suitable template. FIG. 24 depicts an embodiment of a process flow 370 using layer release processing. This flow is based on the use of $Ge_xSi_{1-x}$ sacrificial layer deposition and blanket or selective in-situ-doped epitaxial silicon deposition. The resulting hexagonal-prism unit cells have open apertures on prism top and are terminated at the rear with a rear base layer (in one embodiment, a relatively flat thin silicon layer). Again, the process flow of this embodiment may be easily adjusted in order to use polysilicon, amorphous silicon, or a non-silicon crystalline or polycrystalline/amorphous silicon material. In step 372, a patterned honeycomb-prism template is provided. This template has already been processed to form an embedded array of trenches along with shallower/wider trenches (or trench shoulders) stacked on top of narrower/deeper trenches. There is no dielectric layer on the template frontside, and there is a patterned oxide and/or nitride dielectric layer (or stack) with openings left on the template backside. In step 374, a multi-layer blanket epitaxy is performed in an epitaxial reactor, including the following in-situ process steps. First, $H_2$ bake or $GeH_4/H_2$ bake is used for in-situ surface cleaning. Next, a thin $Ge_xSi_{1-x}$ epitaxial layer is deposited (in one embodiment, on the top only). In one embodiment, this layer is between 10 and 1000 nanometers. Next, a doped silicon epitaxial layer is deposited on the top only. In one embodiment, this layer is p-type, boron-doped and between 1 and 30 microns thick. The in-situ doping (boron doping) profile may be flat or graded. In case of grading, boron doping concentration is gradually increased during the deposition of the silicon epitaxial layer, with a lower concentration at the beginning and a higher concentration towards the end of the epitaxial growth process. This graded base doping may provide a field-assisted drift component for efficient collection of photo-generated carriers, substantially reducing the impact of recombination losses. It also reduces base sheet resistance and ohmic losses. The silicon epitaxial layer thickness is set such that the deep trenches are fully filled with silicon while the shallow (wider) trenches (top trench shoulders) receive epitaxy on their sidewalls and their central regions are left with self-aligned shallow hexagonal troughs. In step 376, the 3-D TFSS substrate is released. A highly selective isotropic wet or dry etch of $Ge_xSi_{1-x}$ is performed, with very high selectivity with respect to silicon. In one embodiment, a mixture of hydrofluoric acid, nitric acid and acetic acid (HNA) is used to selectively etch the $Ge_xSi_{1-x}$ layer. Alternatively, a mixture of ammonia, peroxide, and water ($NH_4OH+H_2O_2+H_2O$) may be used. The wet etchant selectively removes the sacrificial $Ge_xSi_{1-x}$ layer by reaching the sacrificial layer through the template backside dielectric openings. This process releases the hexagonal prism 3-D TFSS substrate, which may then be used for subsequent 3-D TFSS fabrication. In another embodiment, the 3-D TFSS substrate may be released by the methods of the present disclosure.

Note that the template backside openings may be formed directly in silicon backside without a need for the backside dielectric. Alternatively, the sacrificial $Ge_xSi_{1-x}$ layer may be replaced by forming porous $Ge_xSi_{1-x}$ layer or porous silicon layer.

FIG. 25 depicts an embodiment of a process flow 380 for fabrication of self-supporting hexagonal-prism single-aperture 3-D thin-film polysilicon or amorphous silicon TFSS substrates with rear base layers made of polysilicon or amorphous silicon using layer release processing, without the use of epitaxial silicon processing. The amorphous silicon or polysilicon layer may be optionally crystallized using laser crystallization as part of the flow. This process flow uses a dielectric sacrificial layer such as $SiO_2$ (deposited using LPCVD or thermally grown) in conjunction with conformal amorphous silicon or polysilicon deposition for the silicon absorber layer. Step 382 (providing a substrate) corresponds to step 372 in FIG. 24. Step 384 involves depositing a conformal sacrificial layer (or a layer stack). First, a thin layer of a sacrificial material is deposited by conformal layer formation (LPCVD or thermal oxidation). In one embodiment, the sacrificial material is $SiO_2$, with a thickness of between 50 and 2000 nanometers. This sacrificial oxide layer conformally covers the hexagonal-prism trench walls and the template frontside. If subsequent laser crystallization is used, step 384 also includes depositing a thin nitride layer by LPCVD. In one embodiment, this nitride layer is $Si_3N_4$, with a thickness between 100 and 1000 nanometers. The sacrificial layer may be made of porous silicon instead of oxide and/or nitride. Step 386 involves deposition of a blanket silicon layer using conformal deposition. In one embodiment, this blanket silicon layer may be amorphous silicon or polysilicon, p-type in-situ doped with boron, having a thickness between 1 and 30 microns. Note that the silicon thickness is set such that the deep trenches are fully filled with silicon while the shallow (wider) near-surface trenches receive silicon on sidewalls, and their central regions are left with self-aligned relatively shallow hexagonal troughs or trenches. Step 388 involves depositing an optional thin silicon nitride dielectric layer on top by LPCVD or PECVD to serve as a protective cap for silicon layer. In one embodiment, this layer is between 100 and 1000 nanometers. Step 390 involves 3-D TFSS substrate release. In one embodiment and when using a silicon dioxide sacrificial layer, hydrofluoric acid (HF) is used to etch the oxide sacrificial layer. In another embodiment and when using a porous silicon sacrificial layer, a mixture of ammonia, peroxide, and water ($NH_4OH+H_2O_2+H_2O$) or a mixture of hydrogen peroxide and hydrofluoric acid ($H_2O_2+$ HF) or a suitable composition of tri-methyl-ammonium-hydroxide (TMAH) may be used. The etch composition and temperature may be adjusted to achieve maximum etch selectivity for porous silicon with respect to silicon. This process releases the hexagonal-prism 3-D TFSS substrate. Note that the wet etchant selectively removes the sacrificial $Ge_xSi_{1-x}$ layer (or porous silicon sacrificial layer) by reaching the sacrificial layer through the template backside dielectric openings (note that backside openings may be formed directly in the template substrate backside without using any dielectric on the template backside). In another embodiment, the 3-D TFSS substrate may be released by the methods of the present disclosure. This process releases the hexagonal-prism 3-D TFSS substrate from the template. An optional step 392 involves laser crystallization of the released 3-D thin-film amorphous silicon or polysilicon substrate to form a large-grain polysilicon microstructure. The silicon nitride layer surrounding silicon serves as protective cap. The nitride layer is then selectively stripped. The hexagonal-prism 3-D TFSS substrate may then be used for subsequent 3-D TFSS fabrication.

Figure 26:
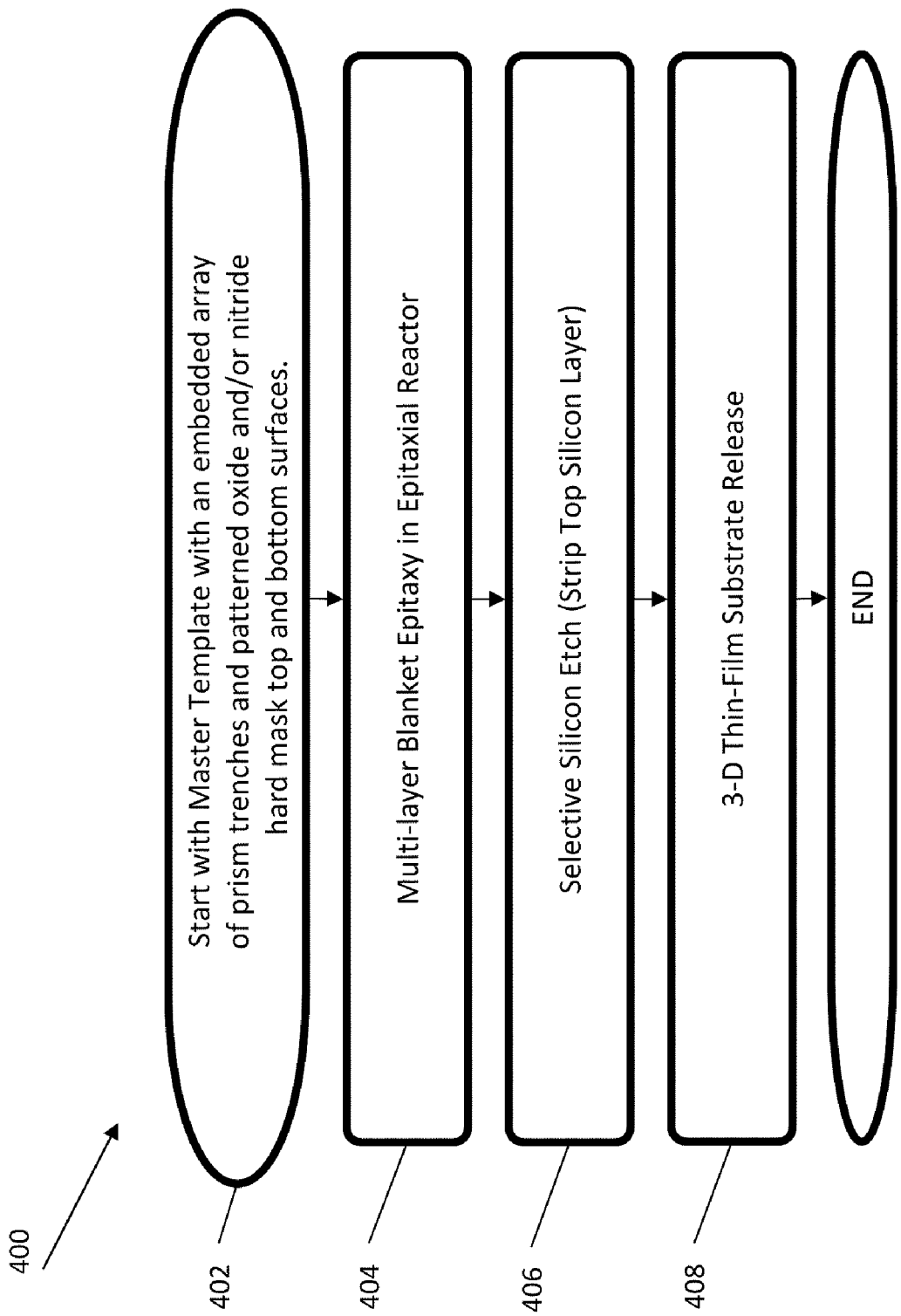
FIG. 26 shows an embodiment of a process flow for fabrication of self-supporting hexagonal prism 3-D TFSS substrates using layer release processing.

FIG. 26 shows an embodiment of a process flow 400 for fabrication of self-supporting (free standing) hexagonal-prism 3-D TFSS substrates using layer release processing. This process flow results in dual-aperture hexagonal-prism 3-D TFSS substrates with hexagonal prisms with open apertures formed on both the top and rear (there is no rear base layer). In step 402, a patterned hexagonal-prism (or another prism array) template is provided. This template has already been processed to form an embedded array of deep hexagonal-prism trenches. There is a patterned dielectric (oxide and/ or nitride) hard mask on the template top and rear surfaces. Step 404 involves a multi-layer blanket epitaxial semiconductor deposition in an epitaxial growth reactor. Step 404 first involves an $H_2$ or $GeH_4/H_2$ in-situ bake cleaning, which is performed after a standard pre-epitaxial wet clean (the latter if necessary). Next, a thin sacrificial epitaxial layer is deposited on the frontside only. In one embodiment, $Ge_xSi_{1-x}$ is used for the sacrificial epitaxial layer and is between 10 and 2000 nanometers (in another embodiment a layer of porous silicon is directly deposited for the sacrificial layer). Next, a doped monocrystalline silicon epitaxial layer is deposited (in one embodiment, on the frontside only). In one embodiment, the layer is p-type, boron-doped and has a thickness between 1 and 30 microns. Step 406 involves selective silicon etch to selectively strip the top silicon layer, stopping on the sacrificial layer. First, the top silicon layer is removed using a selective (wet or dry) silicon etch process until the top $Ge_xSi_{1-x}$ epitaxial layer (or porous silicon) or oxide/nitride hard mask is exposed. When using a plasma (dry) etch process, one embodiment uses optical end-point detection to ensure complete removal of the top silicon layer and exposure of the top sacrificial ($Ge_xSi_{1-x}$ or porous silicon) layer. Step 1908 involves 3-D TFSS substrate release using a selective etchant to etch the sacrificial layer. A highly selective isotropic (in one embodiment, wet) etch of $Ge_xSi_{1-x}$ is performed, with very high selectivity with respect to silicon (in one embodiment, with etch selectivity much better than 100:1). In one embodiment, a mixture of hydrofluoric acid, nitric acid and acetic acid (HNA) is used to etch the sacrificial $Ge_xSi_{1-x}$ layer (etchants such as $H_2O_2+H_2O$ or TMAH may be used to selectively etch porous silicon). Alternatively, a mixture of ammonia, peroxide, and water ($NH_4OH+H_2O_2+H_2O$) may be used. In another embodiment, the 3-D TFSS substrate may be released by the methods of the present disclosure. This process releases the crystalline silicon layer as a hexagonal-prism 3-D TFSS substrate, which may then be used for subsequent 3-D TFSS fabrication.

Figure 27:
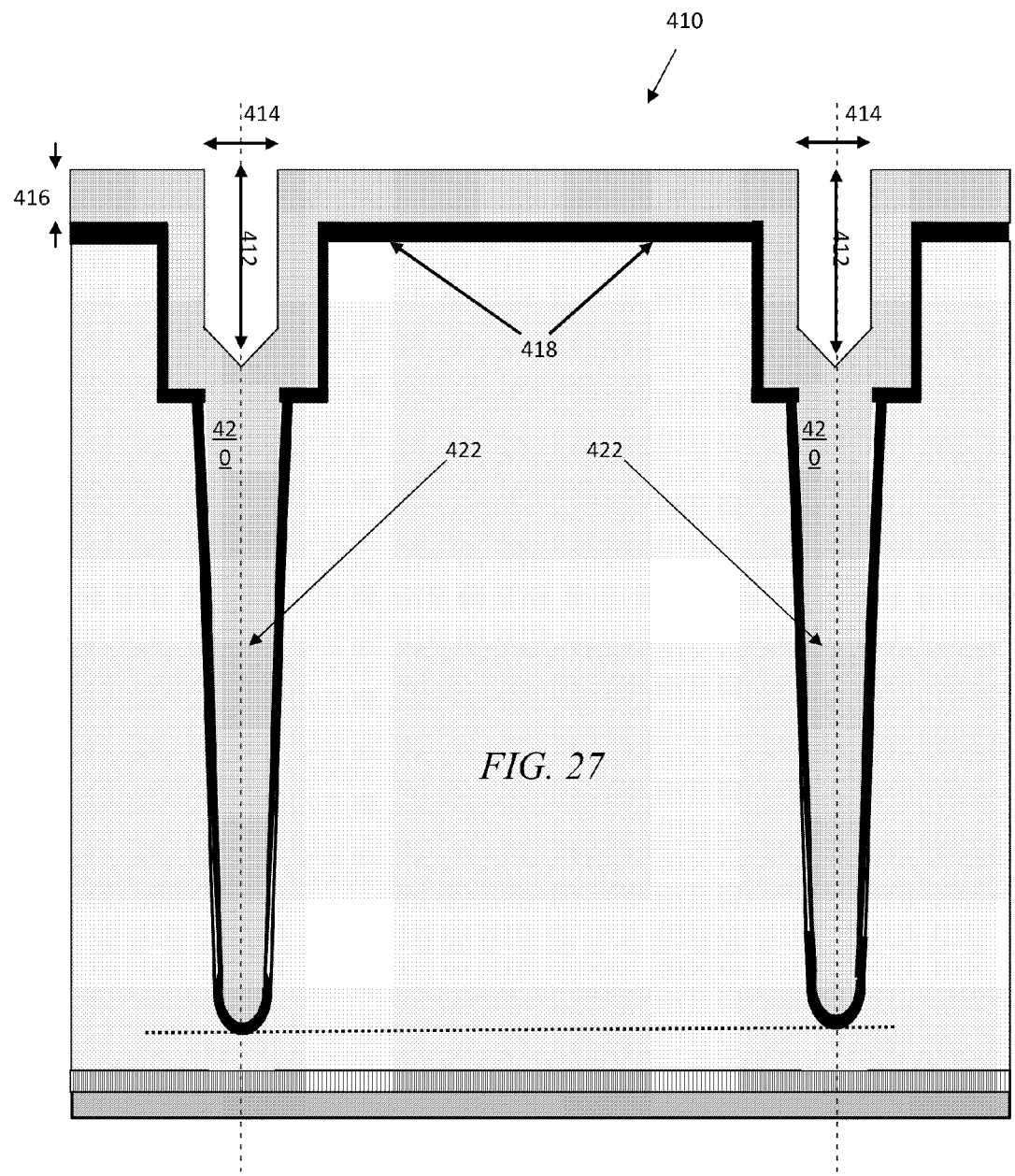
FIGS. 27 through 31 illustrate Y-Y cross-sectional views of a template within-wafer trenches and no dielectrics on the template frontside, as it goes through the key process steps to fabricate a hexagonal prism 3-D TFSS substrate (single-aperture TFSS substrate) with a rear base layer.

FIG. 27 shows a view 410 after deposition of the thin (e.g., 200 to 2000 nanometers thick) sacrificial layer 418 (epitaxial $Ge_xSi_{1-x}$ or porous silicon or another suitable material) and the in-situ-doped (boron-doped for p-type base) epitaxial silicon layer 420. The epitaxial silicon deposition process fills the trenches (void-free trench fill) while leaving relatively shallow troughs (trenches 422) near the top. This may be done by stopping the epitaxial deposition process after the deeper/ narrower trenches are fully filled with epitaxial silicon and before filling of the wider/shallower trenches on the template frontside (thus, forming the shallower troughs with height (L) 412 and width ($W_m$) 414 in conjunction with the top epitaxial silicon layer of thickness ($W_f$) 416.

Figure 28:
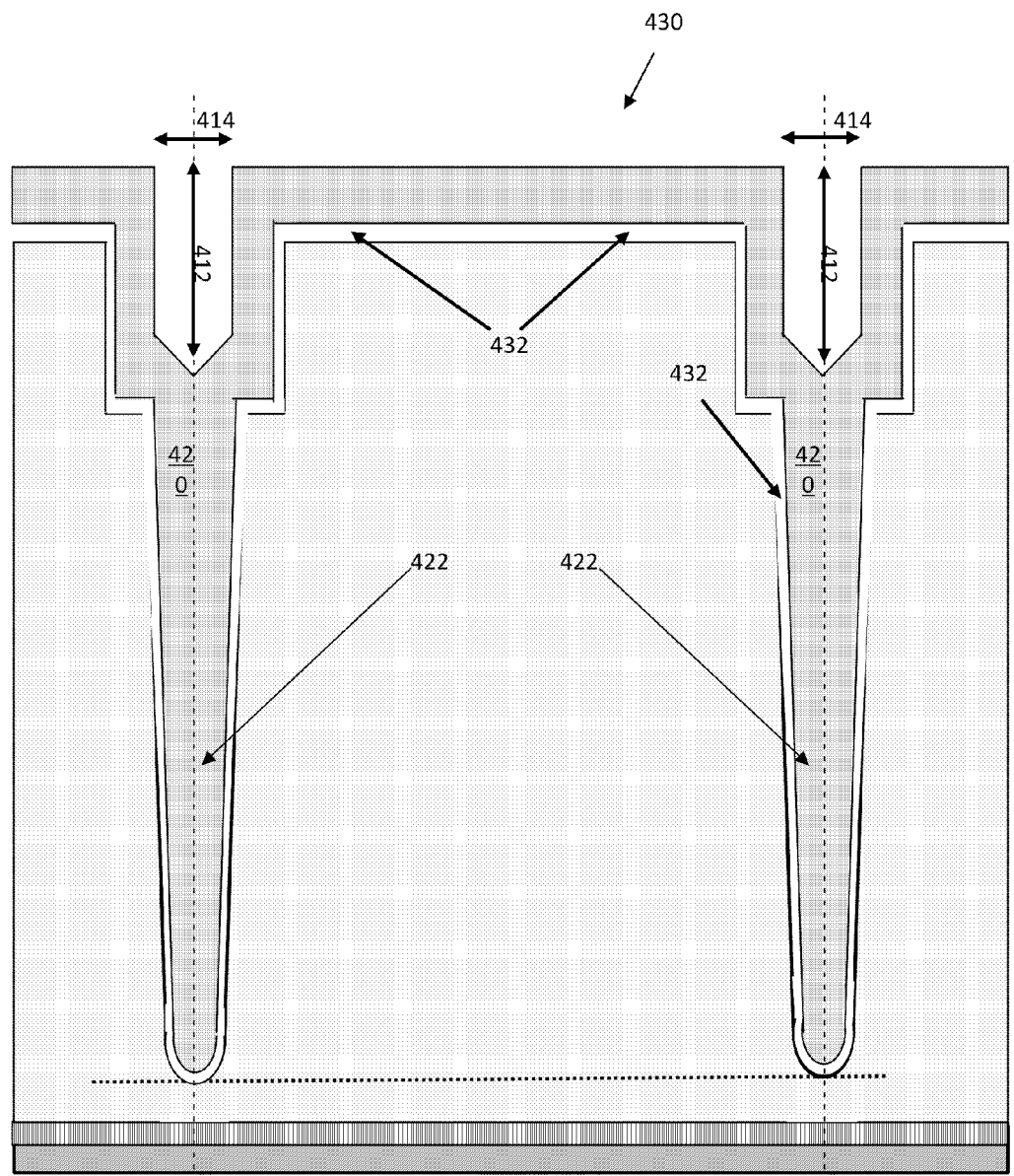
Figure 29:
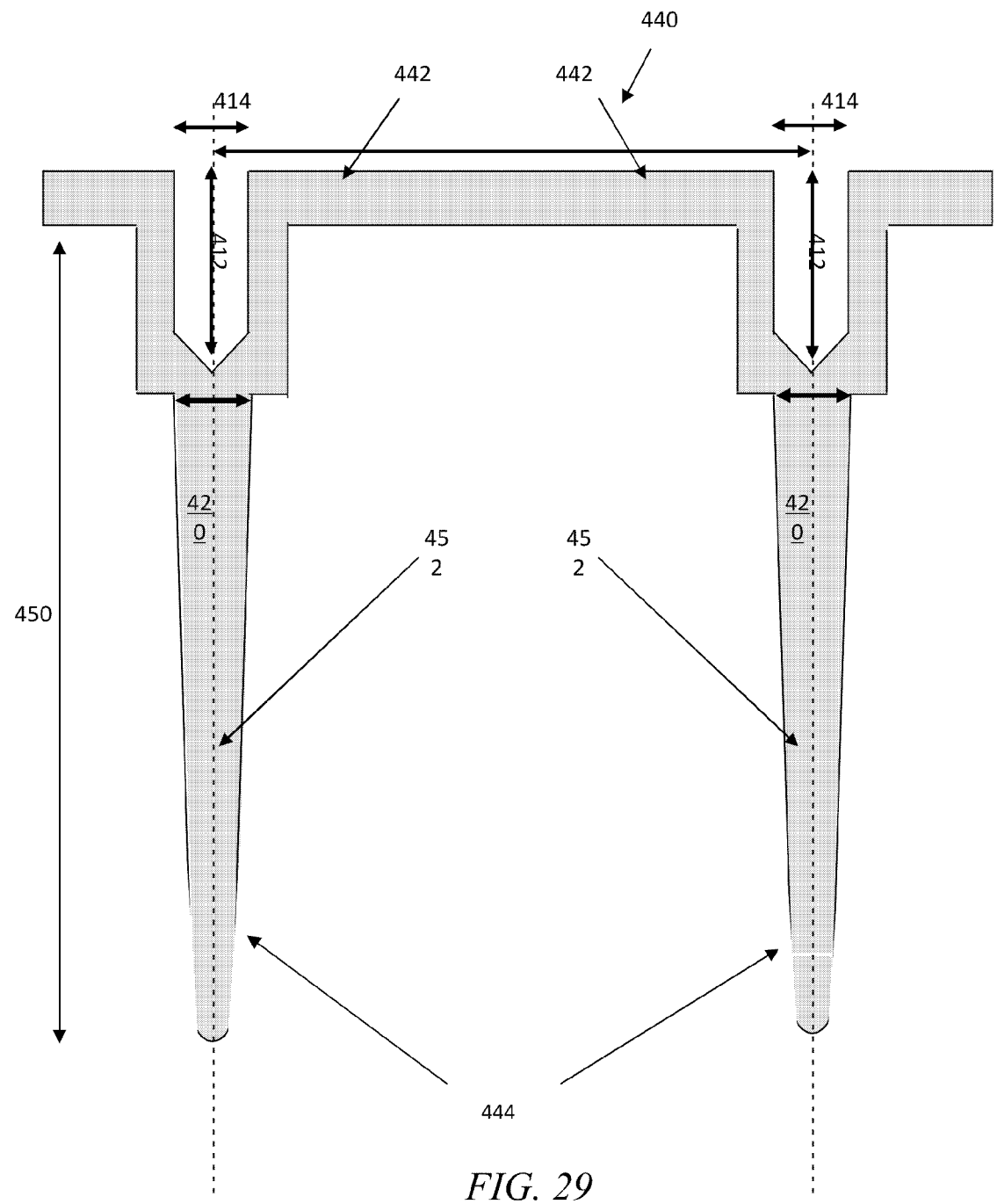
Figure 30:
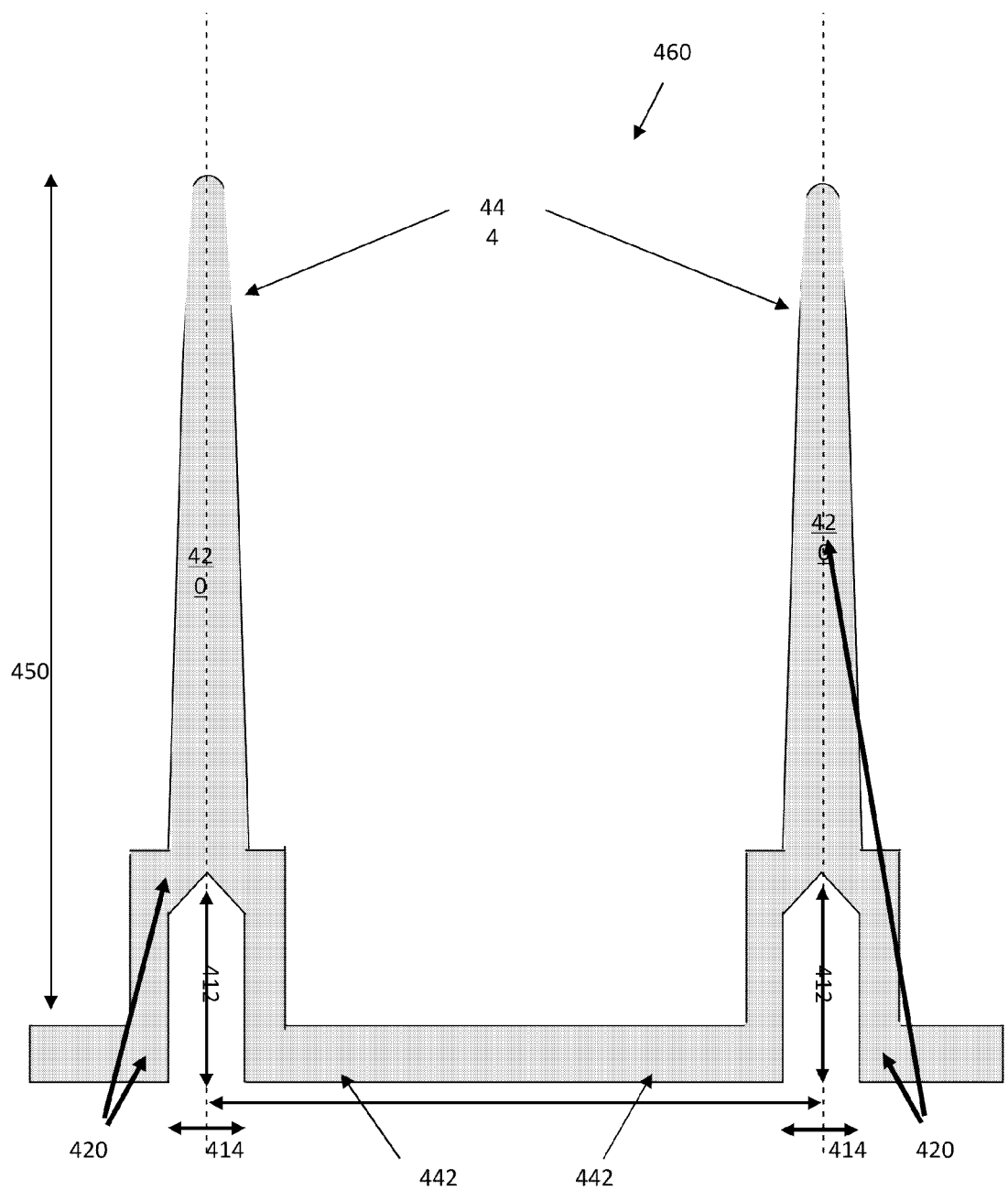
Figure 31:
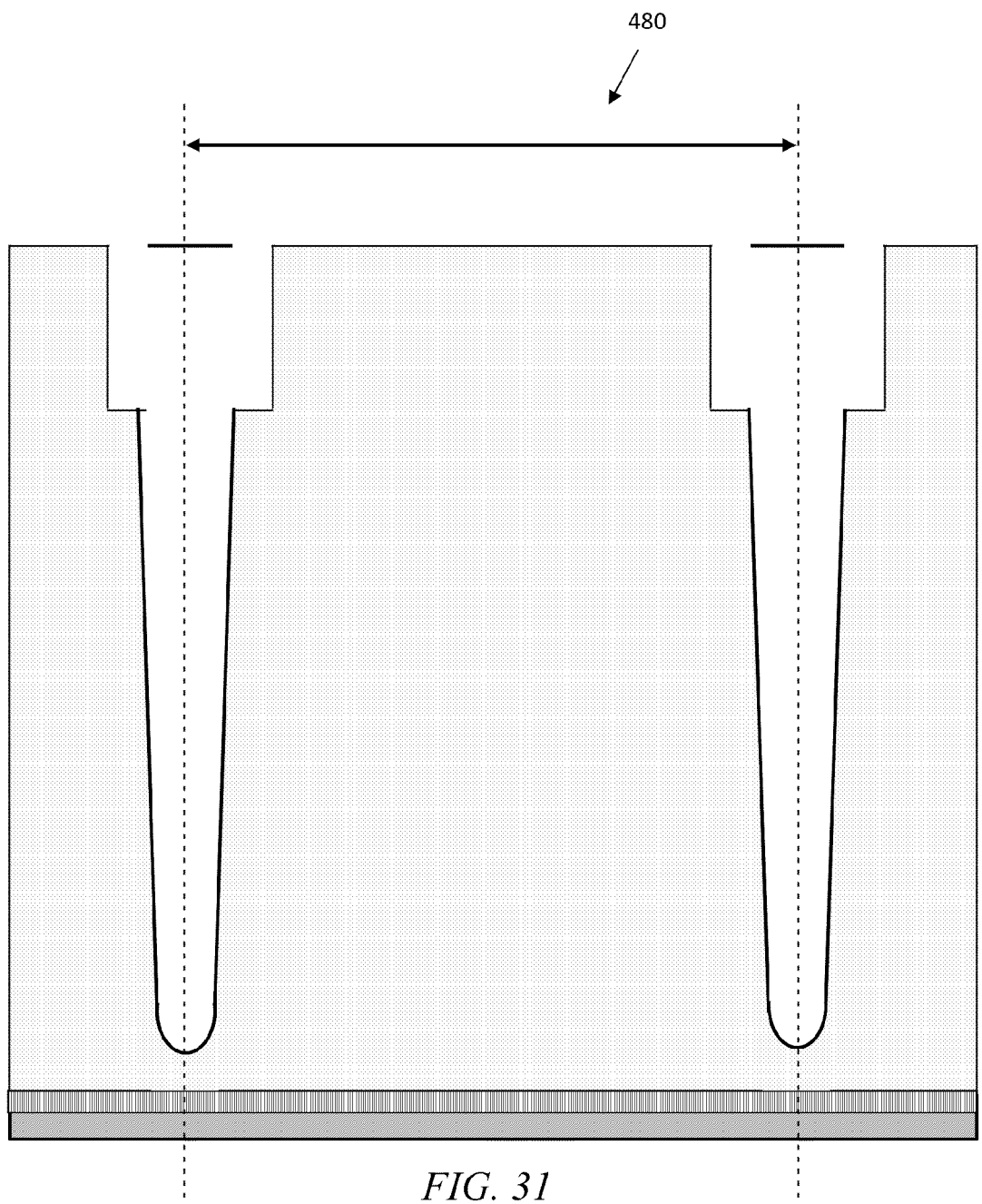

FIG. 28 shows a view 430 of the template in FIG. 27 after highly selective etching of the sacrificial layer 418, thus allowing for release and removal of the 3-D TFSS substrate 420 from the template. The porous silicon layer may also be broken using the methods of the present disclosure. FIGS. 29 and 31 illustrate Y-Y cross-sectional views 440 and 480 of the released substrate 420 from FIG. 28. The released substrate 420 has a base side 442, an emitter side 444. The substrate 420 has dimensions of $T_{st}$ (silicon sidewall thickness near the base side of the hexagonal-prism vertical sidewalls), $T_{sb}$ (silicon sidewall thickness near the emitter side of the hexagonal-prism vertical sidewalls), hexagonal-prism height 450, and tapered hexagonal-prism TFSS substrate sidewalls 452. Referring to the view 460 in FIG. 29, the base side 442 is shown on the top and the emitter side 444 is shown on the bottom (TFSS substrate as released from the template). In the view 460 in FIG. 30, the base side 442 is shown on the bottom and the emitter side 444 is shown on the top. FIG. 31 shows a Y-Y cross-sectional view 480 of the template shown in FIG. 28 after releasing and separating/removing the embedded hexagonal-prism single-aperture 3-D TFSS substrate with a rear base layer. Template 480 is ready for multiple reuse cycles.

Figure 32A:
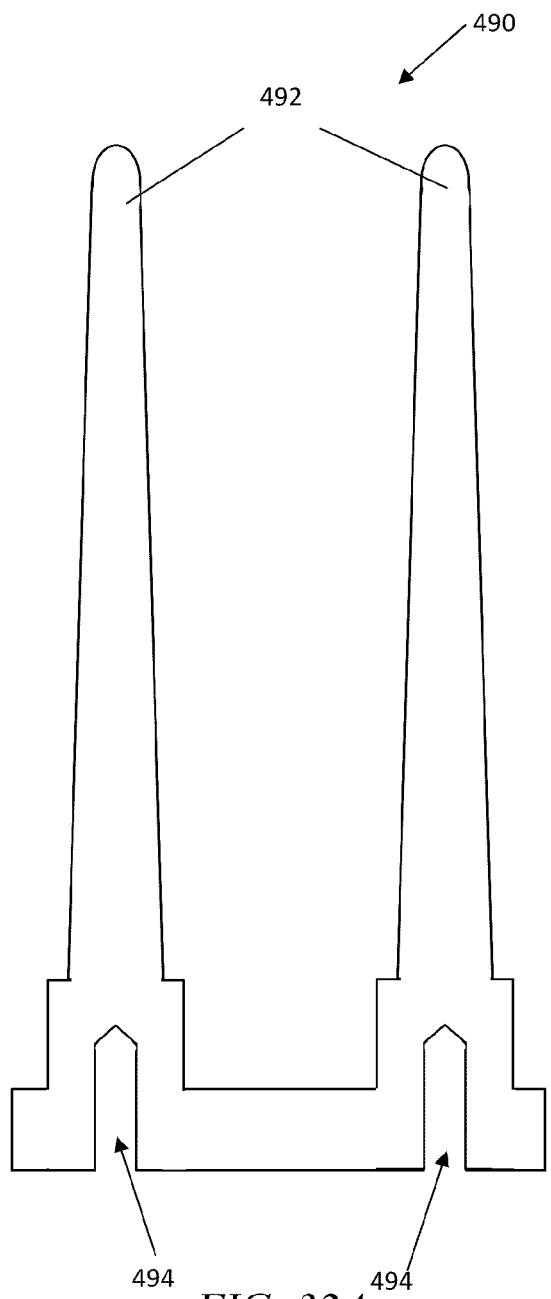
FIGS. 32A through 34B show Y-Y cross-sectional views of a unit cell within an embodiment of a single-aperture hexagonal-prism 3-D TFSS substrate including a rear base layer.

FIG. 32A shows a Y-Y cross-sectional view 510 of a unit cell within a single-aperture hexagonal-prism 3-D TFSS substrate with a rear base layer (released and removed from its template) before cell fabrication. For subsequent $n^+p$ selective emitter formation, the hexagonal-prism sidewalls are in-situ-doped with boron to form the base region at the time of 3-D TFSS substrate fabrication. The sidewalls are doped with boron (in one embodiment, at the time of silicon deposition into the template), either uniformly or in a graded profile, more lightly doped at the prism sidewall surface and more heavily doped towards the sidewall vertical center axis. Similarly, the hexagonal-prism rear base layer is in-situ-doped at the time of 3-D TFSS substrate fabrication. The base layer is doped with boron, either uniformly or in a graded profile, more lightly doped at the rear base layer top surface and more heavily doped towards the rear base layer rear surface, creating a built-in back-surface-field effect in the rear base layer, improving the cell performance. The prism top (emitter side) ridges 512 are used for emitter contact diffusion and metal contact formation and the hexagonal troughs 494 for base contact diffusion and buried metal contact formation.

Figure 32B:
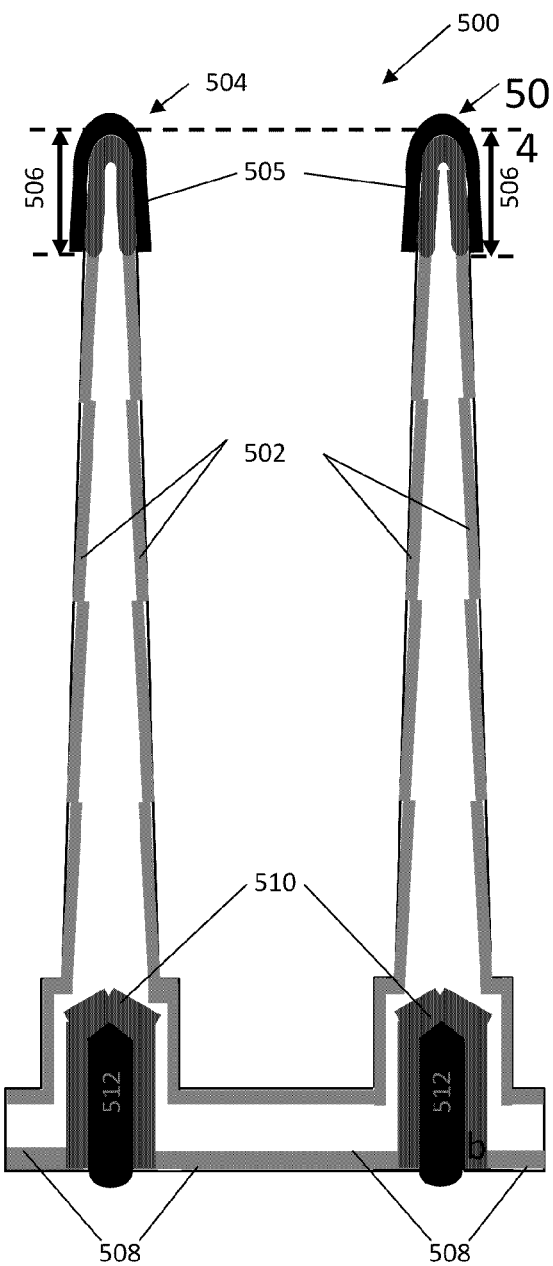

FIG. 32B shows a Y-Y cross-sectional view 520 of a unit cell within the hexagonal prism 3-D TFSS of this disclosure (using the hexagonal prism 3-D TFSS substrate with a rear base layer as shown in FIG. 32A) after self-aligned formation of: selective emitter regions 502 (e.g., less heavily-doped with phosphorus, $n^+$ selective emitter on the hexagonal prism sidewall surfaces as shown); heavily-doped emitter contact regions 504 with coverage height $L_e$ 506 (e.g., more heavily-doped with phosphorus, $n^{++}$ doped emitter contact regions on the hexagonal prism top hexagonal ridges as shown); selective base regions 508 on the rear surface of the rear base layer (e.g., less heavily-doped with boron, $p^+$ selective base on the rear base layer rear surface as shown); and heavily-doped (boron-doped $p^{++}$) base contact diffusion regions 510 in the rear base layer trenches/troughs (e.g., more heavily-doped with boron, $p^{++}$ doped base contact regions). The cured solid dopant source layers for emitter 505 and base regions 512 are shown as dark segments on the top hexagonal-prism ridges and within the rear base rear filled trenches (troughs), respectively.

Figures 33A, 33B:
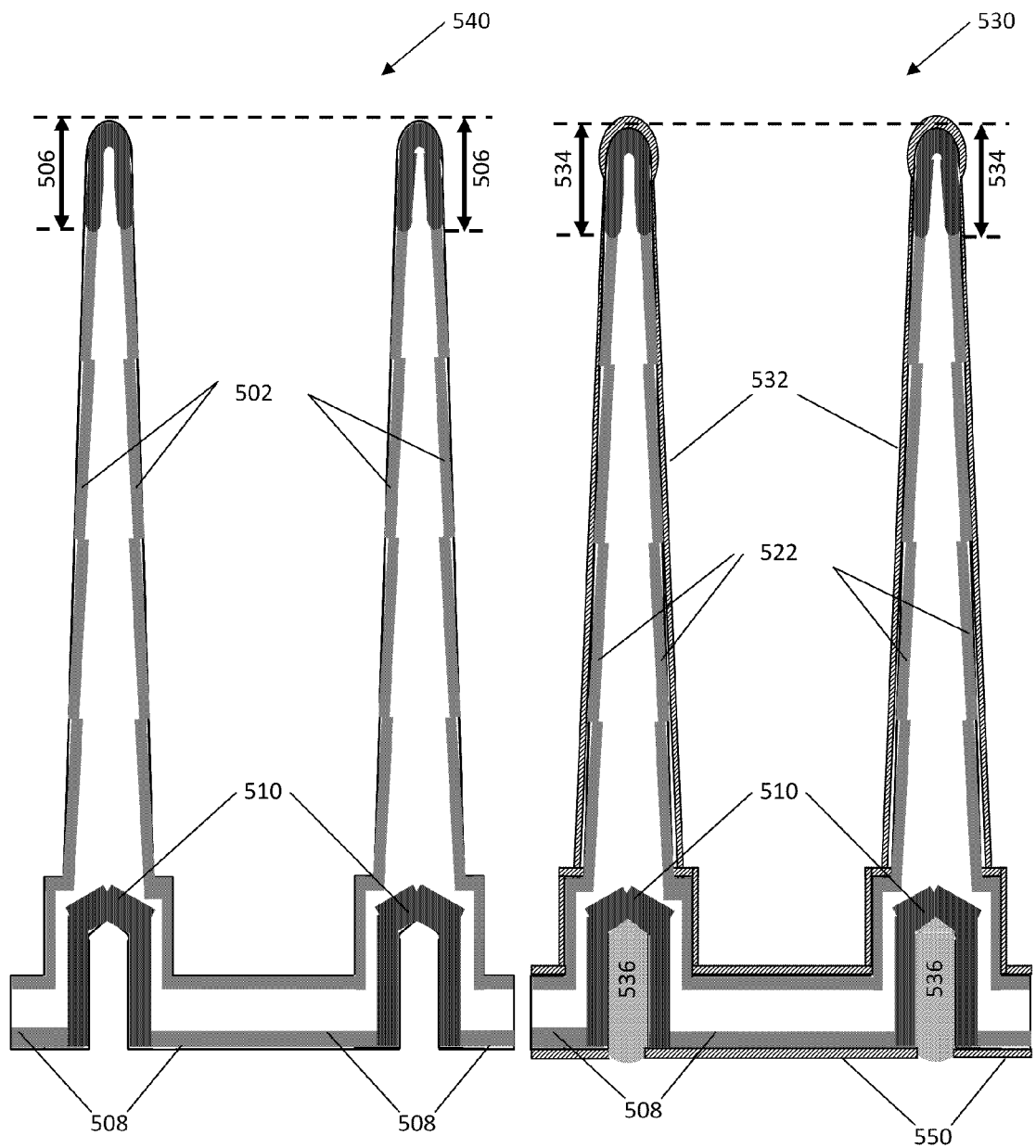
Figure 34A:
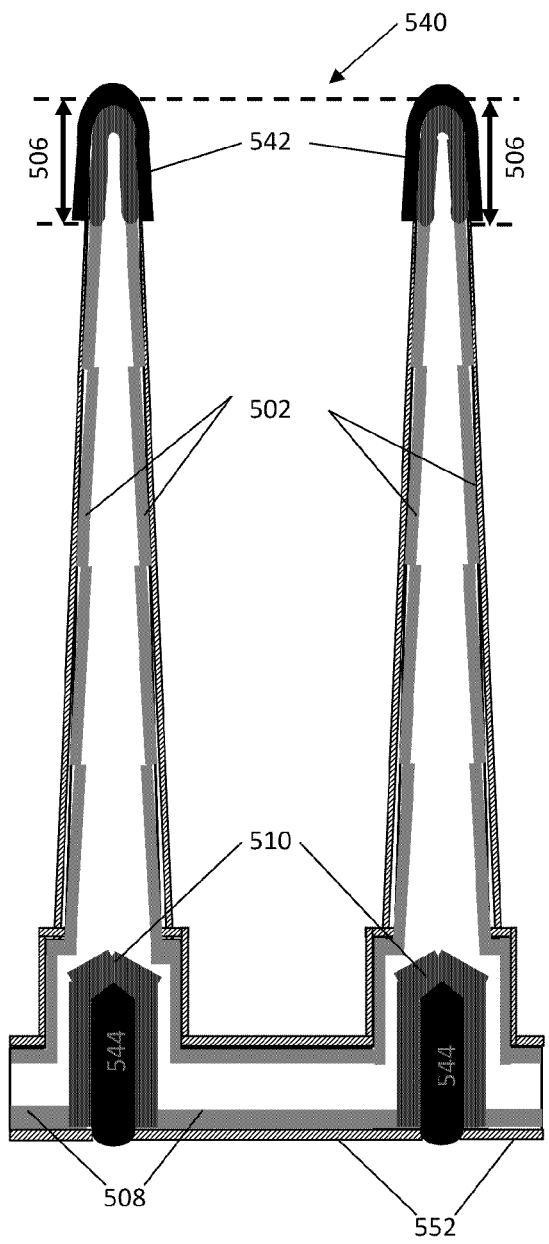
Figure 34B:
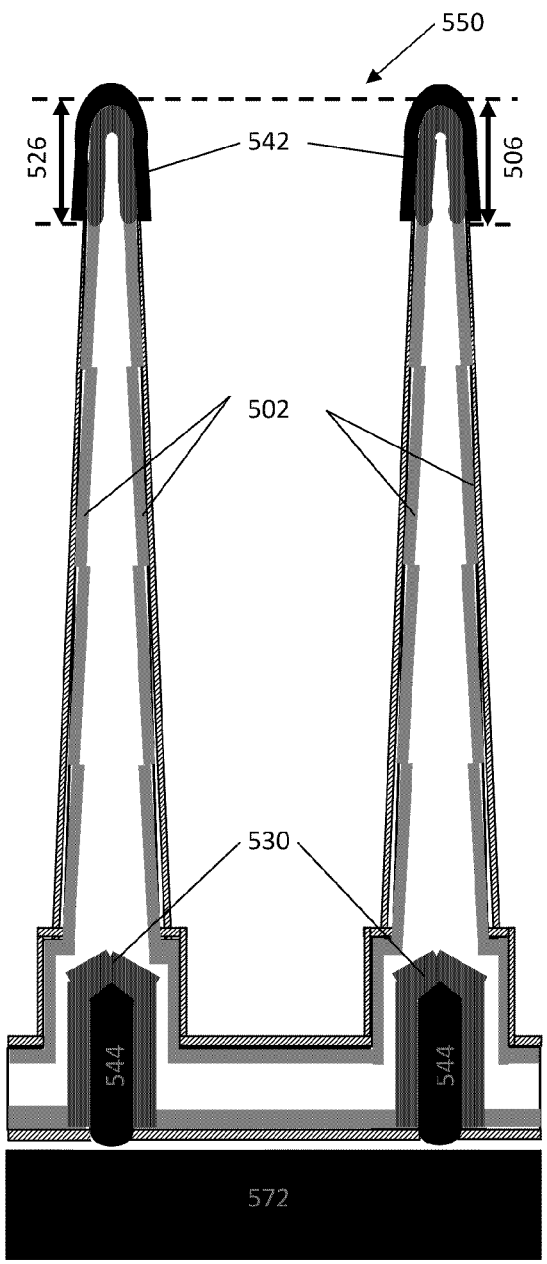

FIG. 33A shows a Y-Y cross-sectional view 520 after the cured n-type and p-type dopant layers have been removed and before the thermal diffusion process. FIG. 33B shows a Y-Y cross-sectional view 530 after formation of surface passivation and anti-reflection coating (thermal $SiO_2$ and/or PVD or PECVD $SiN_x$ or $AlN_x$ ARC) dielectric layers 532. Note $L_e$ 534 and cured boron doped glass 536. FIG. 34A shows a Y-Y cross-sectional view 540 after formation of emitter 542 and base 544 contact metals (silver, aluminum, copper, etc.) by fire-through and/or selective plating. FIG. 34B shows a Y-Y cross-sectional view 550 after the addition of a detached highly reflective rear specular or diffuse mirror 552 (e.g., silver or aluminum coating on a base interconnect plane on a PCB in the solar module assembly; the mirror may contact the rear base contacts as shown).

Figure 35:
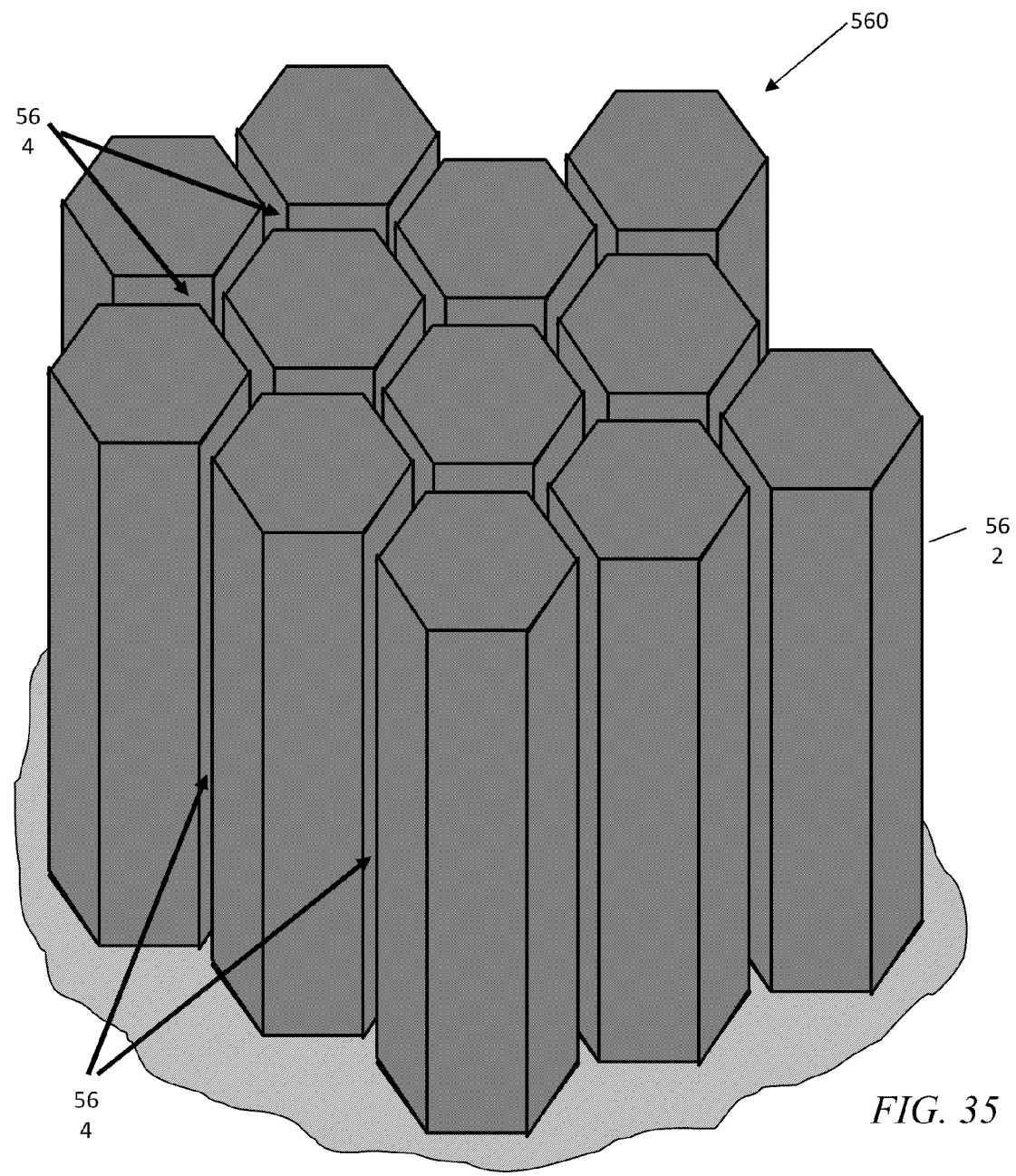
FIG. 35 shows a view of an embodiment of a template including hexagonal prism posts.

FIG. 35 shows a view 560 of a template with hexagonal-prism posts (pillars) 562. A hexagonal-prism 3-D TFSS substrate (not shown) is fabricated by first forming a suitable relatively conformal thin sacrificial layer (in one embodiment, porous silicon) on the template, then filling in the relatively deep trenches 564 between hexagonal-prism posts 562, and subsequently releasing the hexagonal prism 3-D TFSS substrate by selectively etching or fracturing the sacrificial layer (not shown) deposited between the hexagonal-prism 3-D TFSS substrate and the template. In one embodiment, the template has deep interconnected hexagonal-prism trenches with slightly tapered sidewalls (i.e., larger trench widths near the top of the trenched compared to near the bottom of the trenches. Moreover, the trench widths near the top of the trenches may be made about one to several microns larger than the trench widths near the bottom of the trenches.

Figure 36:
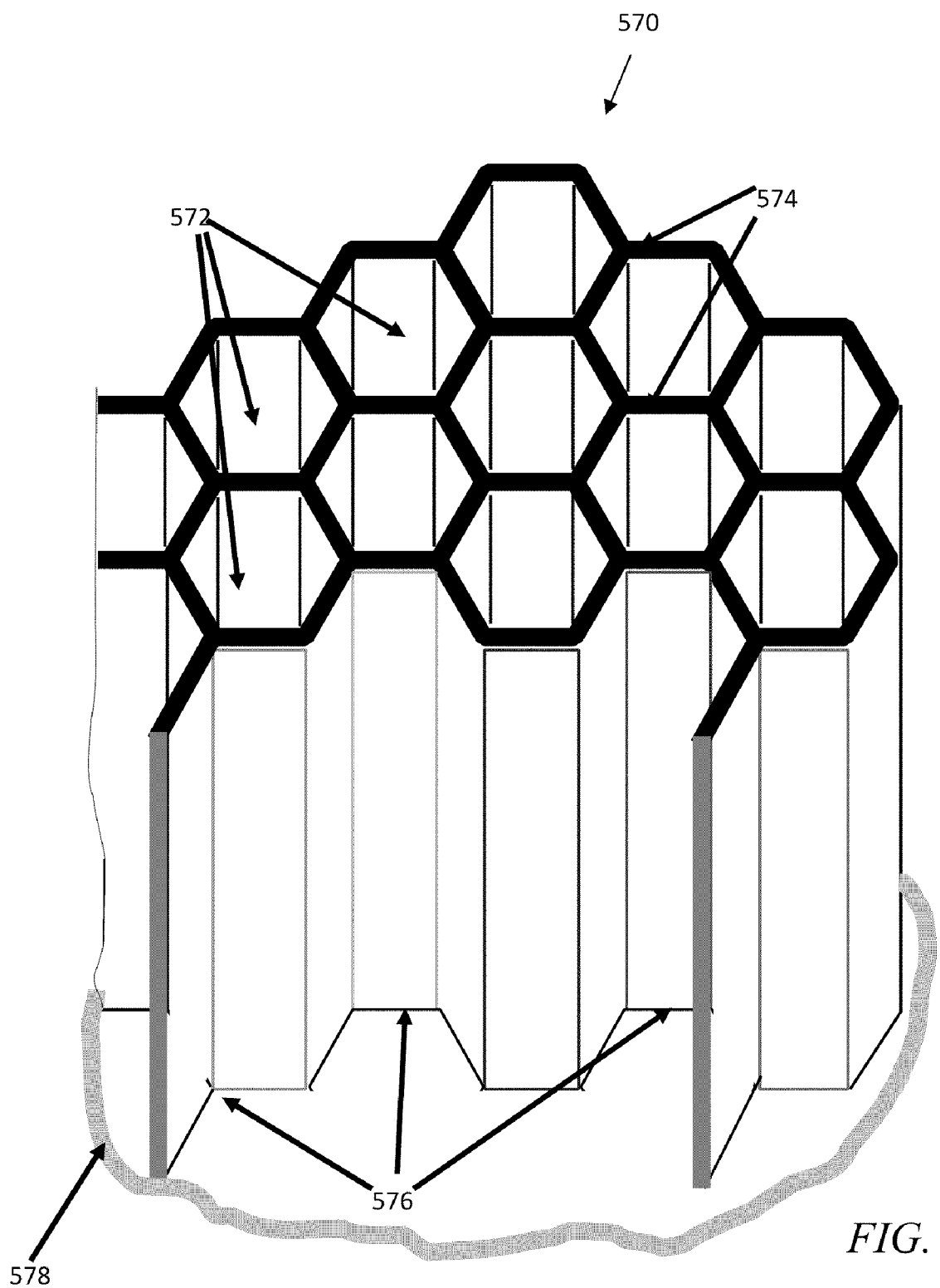
FIG. 36 shows a 3-D cross-sectional view of an embodiment of a single-aperture hexagonal-prism 3-D TFSS substrate (i.e., TFSS substrate with an integral base layer), including the substrate rear monolithically (integrally) connected to a substantially flat planar thin semiconductor film.

FIG. 36 shows a view 570 of a template with hexagonal-prism posts (pillars) 572. A hexagonal-prism 3-D TFSS substrate (not shown) is fabricated by first forming a suitable relatively conformal thin sacrificial layer (in one embodiment, porous silicon) on the template, then filling in the relatively deep trenches 574 between hexagonal-prism posts 572, and subsequently releasing the hexagonal prism 3-D TFSS substrate by selectively etching or fracturing the sacrificial layer (not shown) deposited between the hexagonal-prism 3-D TFSS substrate and the template. In one embodiment, the template has deep interconnected hexagonal-prism trenches with slightly tapered sidewalls (i.e., larger trench widths near the top of the trenched compared to near the bottom of the trenches. Moreover, the trench widths near the top of the trenches may be made about one to several microns larger than the trench widths near the bottom of the trenches.

Figure 37:
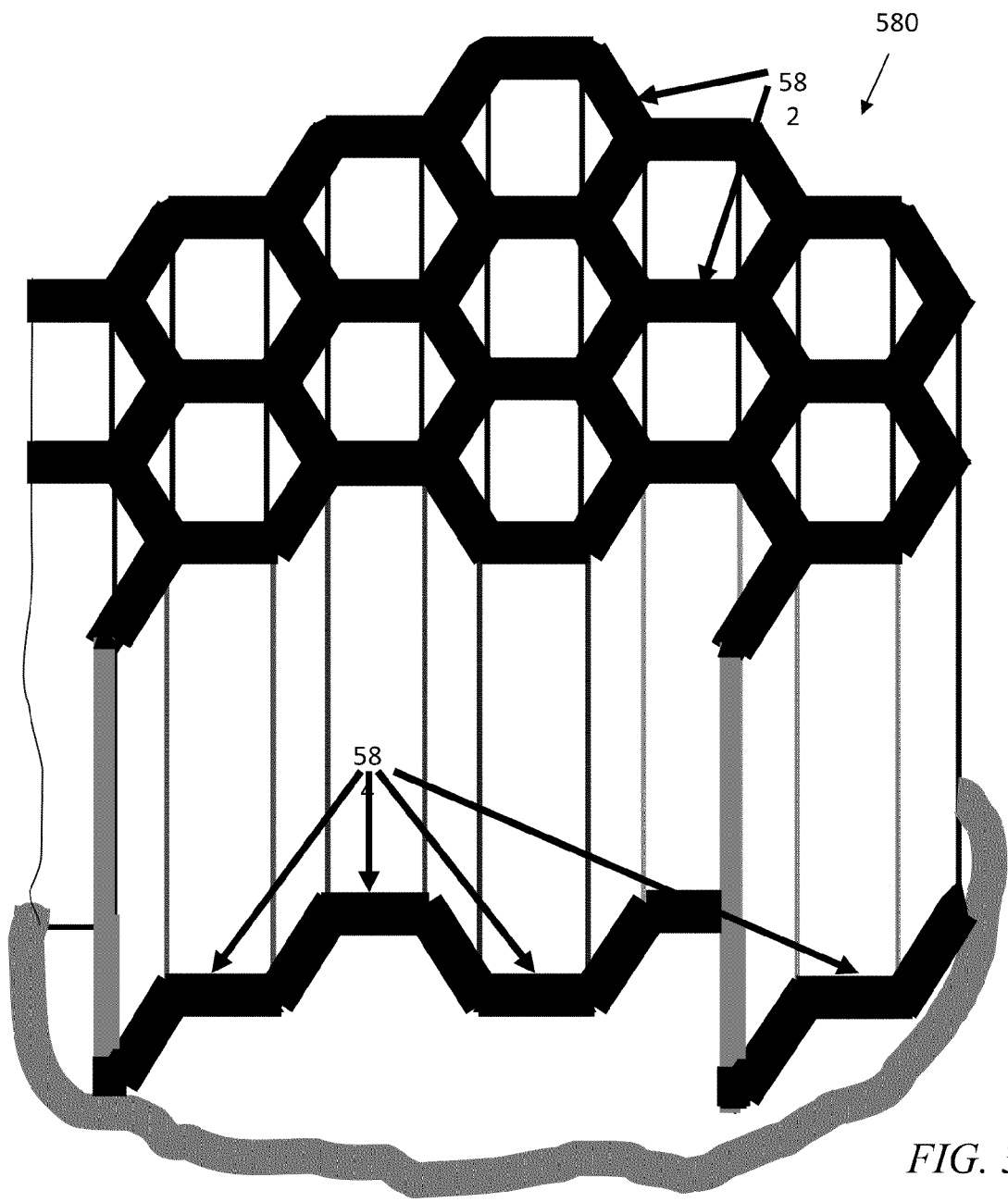
FIG. 37 shows multiple adjacent hexagonal-prism unit cells, after completion of the TFSS fabrication process and after mounting the cell rear base side onto a rear mirror.

FIG. 37 shows a 3-D view 580 of multiple adjacent prism unit cells from a regular hexagonal prism TFSS of this disclosure, after cell fabrication, including self-aligned base and emitter contact metallization. The dark region on the top 582 of the unit cell is the self-aligned emitter contact metal; the rear 584 of the unit cell is the self-aligned base contact metal. The prism sidewall surfaces are doped to form the selective emitter junctions (e.g., shallow $n^+p$ junctions with a junction depth of 0.2 to 0.5 micron in boron-doped silicon base).

Figures 38A, 38B:
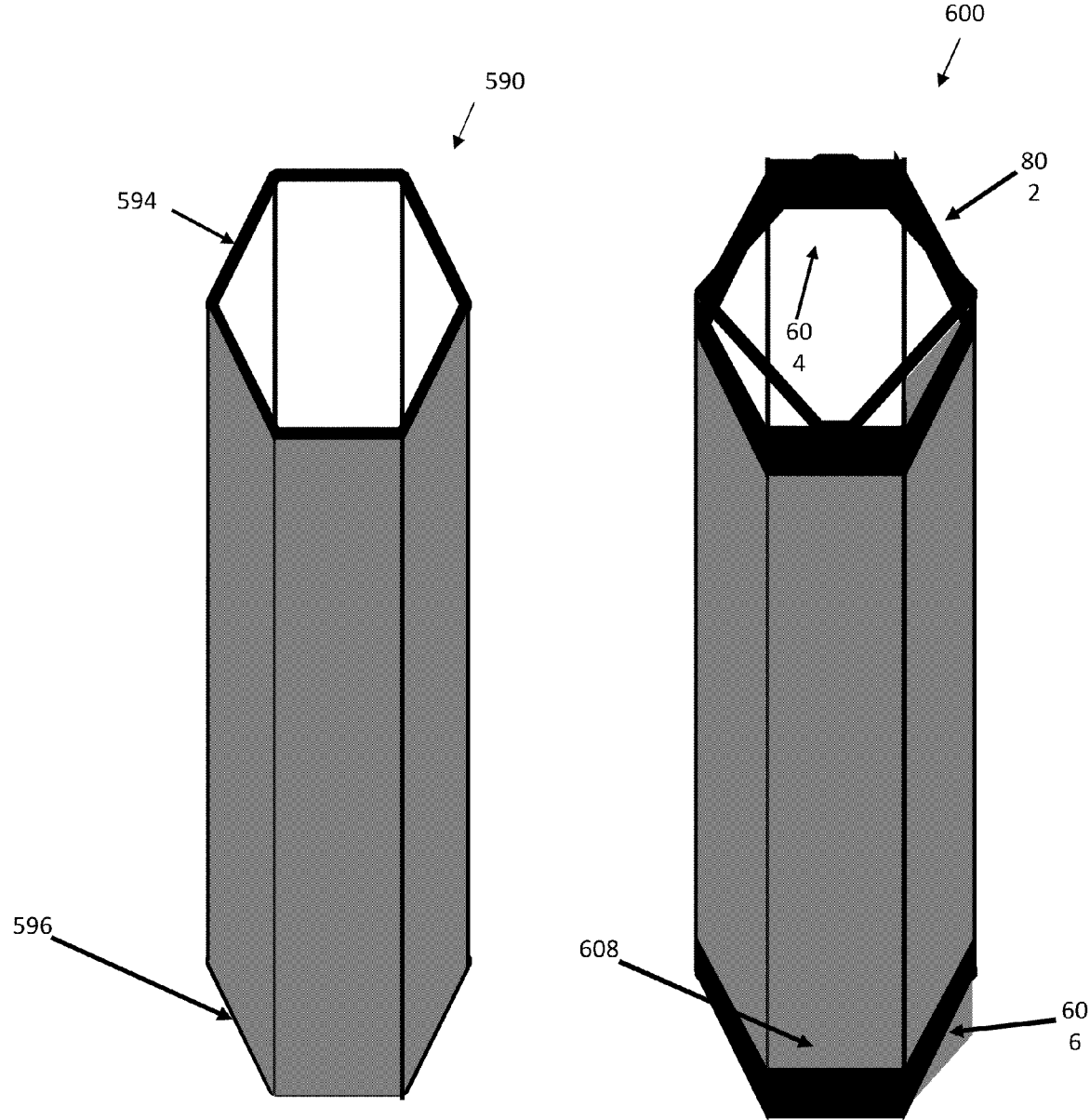
FIGS. 38A and 38B show 3-D views of a single unit cell in a dual-aperture hexagonal-prism 3-D TFSS substrate, before and after self-aligned base and emitter contact metallization, respectively.

FIG. 38A shows a quasi 3-D view 590 of a single unit cell from a regular dual-aperture hexagonal-prism TFSS of this disclosure (shown for the cell without a rear base layer), before self-aligned base and emitter contact metallization. The prism sidewall surfaces are doped to form the selective emitter junctions (e.g., $n^+p$ junctions in boron-doped silicon base). FIG. 38A shows top hexagonal opening 594, which may form the frontside self-aligned emitter metallization contacts 592; and rear (bottom) hexagonal opening 596, which may form the rear selective base self-aligned contacts 594.

FIG. 38B shows a quasi 3-D view 600 of a single unit cell from a regular hexagonal prism TFSS of this disclosure, after cell fabrication, including self-aligned base and emitter contact metallization. The dark region on the top of the unit cell is the self-aligned emitter contact metal 602; the rear of the unit cell is the self-aligned base contact metal 606. The prism sidewall surfaces are doped to form the selective emitter junctions (e.g., shallow $n^+p$ junctions with a junction depth of 0.2 to 0.5 micron in boron-doped silicon base). One embodiment of the present disclosure utilizes a screen printing material having mesh openings less than 10 μm in diameter. The mesh openings must be smaller than the openings of the micro cavities on the 3-D substrate or capillary forces generated by the micro cavities on the 3-D substrate will pull the liquid coating material in. Alternatively, a continuous flexible thin sheet that has a rough surface may be used as a screen printing material.

The foregoing description of the preferred embodiments is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein.

What is claimed is:

1. A method of forming a 3-D thin film semiconductor substrate (TFSS) by releasing it from a semiconductor template through the use of a buried porous semiconductor layer, comprising the steps of:
   forming a buried porous semiconductor layer on a template, said buried porous semiconductor layer formed conformal to said template;
   forming a TFSS on said buried porous semiconductor layer, said TFSS, said buried porous semiconductor layer, and said template forming a wafer, said TFSS having 3-D features in contact with said porous semiconductor layer;
   performing at least one release step which fractures at least a portion of said buried porous semiconductor layer; and
   separating said TFSS and said template.

2. The method of claim 1, wherein said release step further comprises repeating said release step for a plurality of cycles.

3. The method of claim 1, wherein said release step further comprises the step of applying a hydrostatic pressure to said wafer.

4. The method of claim 3, wherein said hydrostatic pressure is in the range of approximately 0.1 GPa to 100 GPa.

5. The method of claim 1, wherein said release step further comprises thermally expanding and/or contracting said buried porous semiconductor layer.

6. The method of claim 5, wherein said step of thermally expanding and/or contracting said buried porous semiconductor layer further comprises the step of contacting at least one temperature controlled chuck to said wafer.

7. The method of claim 6, wherein said at least one temperature controlled wafer chuck is in a temperature range bound between approximately −50° and 350° C.

8. The method of claim 5, wherein said step of thermally expanding or contracting said buried porous semiconductor layer further comprises the step of heating said wafer through infrared (IR) laser irradiation.

9. The method of claim 8, wherein said step of heating said wafer using IR laser irradiation further comprises the step of heating said wafer using a $CO_2$ laser.

10. The method of claim 8, wherein said step of heating said wafer using IR laser irradiation source further comprises the step of heating said wafer using a YAG laser.

11. The method of claim 5, wherein said step of thermally expanding or contracting said buried porous semiconductor layer further comprises the step of dispensing or immersing a wafer in a heating or cooling source.

12. The method of claim 11, wherein said cooling source comprises at least one of liquid nitrogen, inert gases, cold air, or $CO_2$ snow (dry ice) or said heating source comprises at lease one of hot liquid, DI water, steam, temperature controlled oven, or hot air.

13. The method of claim 5, wherein said step of thermally expanding or contracting said buried porous semiconductor layer further comprises the step of heating said wafer with a Rapid Thermal Processing (RTP) heating source.

14. The method of claim 1, wherein said release step further comprises the step of exposing said wafer to ultrasonic energy.

15. The method of claim 1, wherein said release step further comprises the step of mechanically bending said wafer.

16. The method of claim 1, wherein said release step further comprises the step of introducing a liquid or gas into the pores of said buried porous semiconductor layer and then expanding and/or contracting said liquid or said gas.

17. The method of claim 16, wherein said liquid or said gas comprises an etchant.

18. The method of claim 16, wherein said step of expansion and/or contraction further comprises the step of heating or cooling of said liquid or gas, said heating or cooling resulting in a phase change of said liquid or gas.

19. The method of claim 16, wherein said expansion step further comprises the step of loading said wafer into a vacuum chamber and rapidly depressurizing said vacuum chamber.

20. The method of claim 1, wherein a said release step further comprises a final cleaning step wherein said final cleaning step further comprises a megasonic or ultrasonic cleaning step or a mechanical precision pulling step.

21. The method of claim 1, wherein said step of forming a buried porous semiconductor layer on a template further comprises the step of forming a buried porous silicon layer.

22. The method of claim 1, wherein said step of forming a buried porous semiconductor layer on a template further comprises the step of forming said buried porous semiconductor layer on a silicon template.

23. The method of claim 1, wherein forming a TFSS on said buried porous semiconductor layer further comprises the step of forming a thin-film silicon substrate.

* * * * *